US012598698B2

(12) United States Patent (10) Patent No.: US 12,598,698 B2
Tamaki et al. (45) Date of Patent: Apr. 7, 2026

(54) WIRING CIRCUIT BOARD

(71) Applicant: NITTO DENKO CORPORATION, Osaka (JP)

(72) Inventors: Yusaku Tamaki, Osaka (JP); Shusaku Shibata, Osaka (JP); Teppei Niino, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 29 days.

(21) Appl. No.: 18/261,231

(22) PCT Filed: Dec. 3, 2021

(86) PCT No.: PCT/JP2021/043378
§ 371 (c)(1),
(2) Date: Jul. 12, 2023

(87) PCT Pub. No.: WO2022/158118
PCT Pub. Date: Jul. 28, 2022

(65) Prior Publication Data
US 2024/0090128 A1 Mar. 14, 2024

(30) Foreign Application Priority Data

Jan. 19, 2021 (JP) ................................. 2021-006128
Oct. 26, 2021 (JP) ................................. 2021-174535

(51) Int. Cl.
H05K 1/05 (2006.01)

(52) U.S. Cl.
CPC ..... H05K 1/056 (2013.01); H05K 2201/0939 (2013.01); H05K 2201/09445 (2013.01)

(58) Field of Classification Search
CPC ........... H05K 1/056; H05K 2201/0939; H05K 2201/09445
See application file for complete search history.

(56) References Cited

U.S. PATENT DOCUMENTS

| | | | |
|---|---|---|---|
| 6,399,899 B1 | 6/2002 | Ohkawa et al. | |
| 7,652,890 B2 * | 1/2010 | Ohsawa ................. | H05K 1/025 |
| | | | 361/776 |
| 2007/0290327 A1 | 12/2007 | Nakasato et al. | |
| 2010/0246140 A1 | 9/2010 | Nakasato et al. | |

(Continued)

FOREIGN PATENT DOCUMENTS

| | | |
|---|---|---|
| CN | 104219872 A | 12/2014 |
| JP | 2001-209918 A | 8/2001 |

(Continued)

OTHER PUBLICATIONS

International Preliminary Report on Patentability issued by WIPO on Jul. 20, 2023, in connection with International Patent Application No. PCT/JP2021/043378.

(Continued)

*Primary Examiner* — Jeremy C Norris
(74) *Attorney, Agent, or Firm* — Edwards Neils LLC; Jean C. Edwards, Esq.

(57) ABSTRACT

A wiring circuit board includes a metal supporting substrate, an insulating layer, and a conductive layer in this order in a thickness direction. The conductive layer includes at least one terminal portion and a wiring portion extending from the terminal portion. The metal supporting substrate has an opening portion. The opening portion penetrates the metal supporting substrate in the thickness direction and faces the terminal portion through the insulating layer. The opening portion has a first opening peripheral edge on one side in the thickness direction and a second opening peripheral edge on the other side in the thickness direction. In a projected view in the thickness direction, the second opening peripheral edge is disposed outside the first opening peripheral edge and extends along the first opening peripheral edge.

13 Claims, 23 Drawing Sheets

(56) References Cited

U.S. PATENT DOCUMENTS

| | | | | |
|---|---|---|---|---|
| 2011/0048785 A1* | 3/2011 | Ishii | ...................... | H05K 3/303 |
| | | | | 29/830 |
| 2011/0286132 A1 | 11/2011 | Ishii | | |
| 2012/0212858 A1 | 8/2012 | Arai | | |
| 2012/0279757 A1 | 11/2012 | Ishii et al. | | |
| 2013/0299451 A1 | 11/2013 | Ishii | | |
| 2014/0353007 A1 | 12/2014 | Ichinose et al. | | |
| 2017/0288202 A1 | 10/2017 | Tarlau et al. | | |
| 2018/0075871 A1 | 3/2018 | Sugimoto et al. | | |
| 2021/0035874 A1 | 2/2021 | Kudo et al. | | |

FOREIGN PATENT DOCUMENTS

| | | | |
|---|---|---|---|
| JP | 2008-028376 A | 2/2008 | |
| JP | 2011-049316 A | 3/2011 | |
| JP | 2011-243267 A | 12/2011 | |
| JP | 2012-169025 A | 9/2012 | |
| JP | 2012-235013 A | 11/2012 | |
| JP | 2013-145627 A | 7/2013 | |
| JP | 2018-045748 A | 3/2018 | |
| JP | 2019-212675 A | 12/2019 | |
| WO | 2017/209296 A1 | 12/2017 | |

OTHER PUBLICATIONS

International Search Report issued in PCT/JP2021/043378 on Feb. 15, 2022.

Written Opinion issued in PCT/JP2021/043378 on Feb. 15, 2022.

Notice of Reasons for Refusal issued in Japanese Patent Application No. 2021-174535 on Oct. 25, 2022.

Office Action, issued by the Taiwanese Intellectual Property Office on Aug. 14, 2025, in connection with Taiwanese Patent Application No. 110145211.

Office Action, issued by the Japanese Patent Office on Aug. 26, 2025, in connection with Japanese Patent Application No. 2022-210574.

Office Action, which was issued by Vietnam Intellectual Property Office on Nov. 27, 2025, in connection with Vietnamese Patent Application No. 1-2023-04650.

Office Action, which was issued by the Korean Intellectual Property Office on Oct. 29, 2025, in connection with Korean Patent Application No. 10-2023-7023723.

Office Action, which was issued by Japanese Patent Office on Jan. 27, 2026, in connection with Japanese Patent Application No. 2022-210574.

* cited by examiner

FIG. 5A
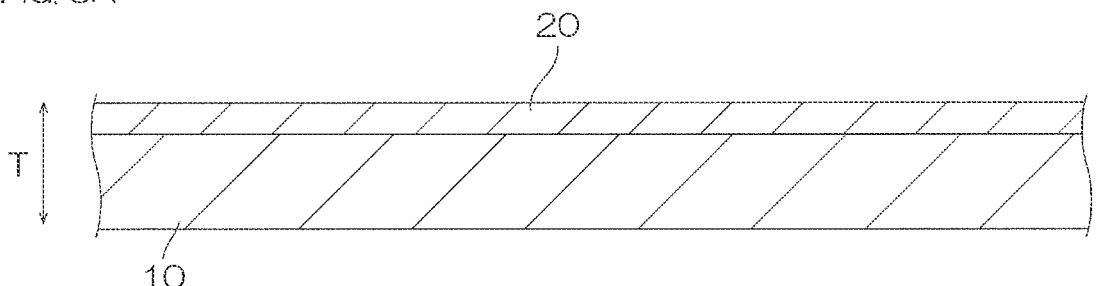
FIG. 5B
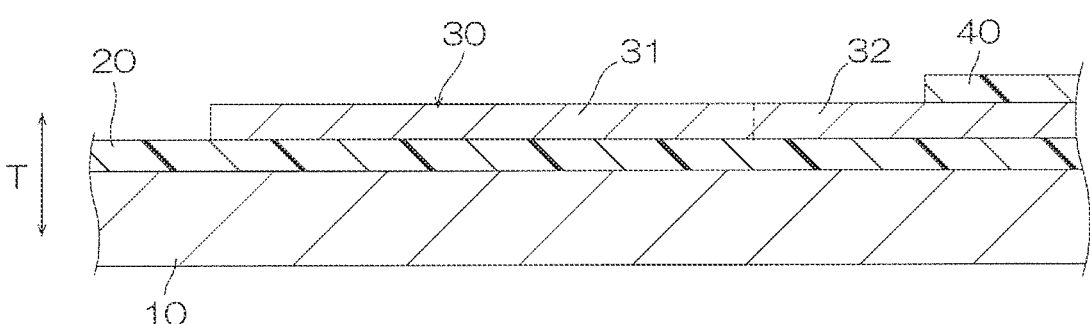
FIG. 5C
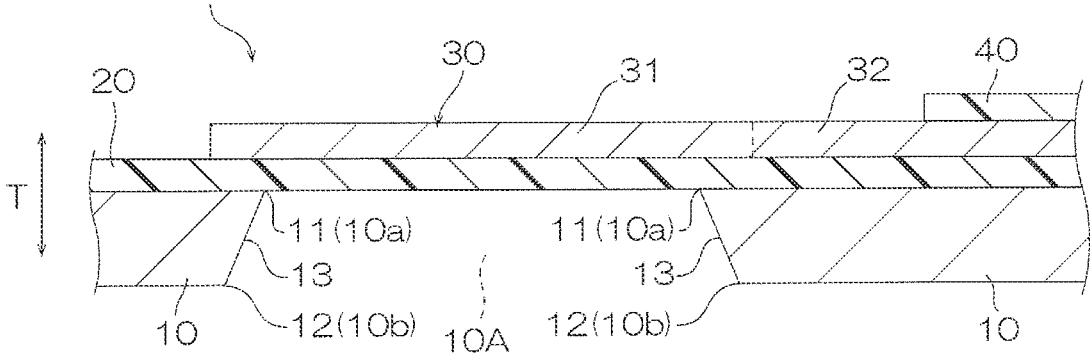
FIG. 5D

WIRING CIRCUIT BOARD

CROSS-REFERENCE TO RELATED APPLICATIONS

The present application is a 35 U.S.C. 371 National Stage Entry of PCT/JP2021/043378, filed on Dec. 3, 2021, which claims priority from Japanese Patent Application Nos. 2021-006128, filed on Jan. 19, 2021, and 2021-174535, filed on Oct. 26, 2021, the contents of all of which are herein incorporated by reference in their entirety.

TECHNICAL FIELD

The present invention relates to a wiring circuit board.

BACKGROUND ART

A wiring circuit board including a metal supporting substrate, an insulating layer on the metal supporting substrate, and a conductive layer on the insulating layer is known. The conductive layer includes a wiring portion, and a terminal portion connected to the wiring portion. In the wiring circuit board, for example, characteristic impedance of the terminal portion is adjusted for impedance matching between the wiring portion and the terminal portion. The characteristic impedance of the terminal portion is, for example, adjusted by forming an opening portion facing the terminal portion through the insulating layer in the metal supporting substrate. Such a wiring circuit board is described in, for example, Patent Document 1 below.

CITATION LIST

Patent Document

Patent Document 1: Japanese Unexamined Patent Publication No. 2012-235013

SUMMARY OF THE INVENTION

Problem to be Solved by the Invention

In a projected view in a thickness direction of the wiring circuit board, the larger the area of the opening portion with respect to the area of the terminal portion, the less support strength of the terminal portion by the metal supporting substrate. Therefore, when the opening portion is too large with respect to the terminal portion, the support strength of the terminal portion by the metal supporting substrate becomes insufficient. A terminal of an external component cannot be appropriately connected to the terminal portion having the insufficient support strength. On the other hand, the opening portion having a sufficient size cannot be formed, and therefore, the adjustment of the characteristic impedance may become insufficient.

The present invention provides a wiring circuit board suitable for adjusting characteristic impedance of a terminal portion while ensuring support strength with respect to the terminal portion.

Means for Solving the Problem

The present invention [1] includes a wiring circuit board including a metal supporting substrate, an insulating layer, and a conductive layer in this order toward one side in a thickness direction, wherein the conductive layer includes at least one terminal portion and a wiring portion extending from the terminal portion; the metal supporting substrate has an opening portion that penetrates the metal supporting substrate in the thickness direction and facing the terminal portion through the insulating layer; the opening portion has a first opening peripheral edge on one side in the thickness direction and a second opening peripheral edge on the other side in the thickness direction; and in a projected view in the thickness direction, the second opening peripheral edge is disposed outside the first opening peripheral edge and extends along the first opening peripheral edge.

In the wiring circuit board of the present invention, as described above, the opening portion facing the terminal portion through the insulating layer is formed in the metal supporting substrate. Such a configuration is suitable for adjusting characteristic impedance of the terminal portion. In addition, in the projected view in the thickness direction of the wiring circuit board, the second opening peripheral edge is disposed outside the first opening peripheral edge, and extends along the first opening peripheral edge. That is, in the opening portion, the opening area of the end portion on one side, terminal portion-side, in the thickness direction is relatively small, and the opening area of the end portion on the other side in the thickness direction is relatively large. Such a configuration is suitable for adjusting the characteristic impedance of the terminal portion by ensuring wide opening space of the opening portion, while suppressing a decrease in support strength of the terminal portion by the metal supporting substrate. Therefore, the wiring circuit board of the present invention is suitable for adjusting the characteristic impedance of the terminal portion while ensuring the support strength with respect to the terminal portion.

The present invention [2] includes the wiring circuit board described in the above-described [1], wherein in the projected view, the entire first opening peripheral edge is disposed inside the terminal portion.

Such a configuration is preferable from the viewpoint of ensuring the support strength of the terminal portion by the metal supporting substrate.

The present invention [3] includes the wiring circuit board described in the above-described [2], wherein in the projected view, the entire second opening peripheral edge is disposed inside the terminal portion.

Such a configuration is preferable from the viewpoint of ensuring the support strength of the terminal portion by the metal supporting substrate.

The present invention [4] includes the wiring circuit board described in the above-described [1], wherein in the projected view, the entire first opening peripheral edge is disposed outside the terminal portion.

Such a configuration is preferable from the viewpoint of ensuring the wide opening space of the opening portion.

The present invention [5] includes the wiring circuit board described in the above-described [2] or [4], wherein in the projected view, the entire second opening peripheral edge is disposed outside the terminal portion.

Such a configuration is preferable from the viewpoint of ensuring the wide opening space of the opening portion.

The present invention [6] includes the wiring circuit board described in the above-described [1], wherein the first opening peripheral edge includes a first portion disposed inside the terminal portion in the projected view, and a second portion disposed outside the terminal portion in the projected view.

Such a configuration is preferable from the viewpoint of both ensuring the support strength of the terminal portion by the metal supporting substrate and ensuring the opening space of the opening portion.

The present invention [7] includes the wiring circuit board described in the above-described [6], wherein the second opening peripheral edge includes a third portion disposed inside the terminal portion and extends along the first portion in the projected view.

Such a configuration is preferable from the viewpoint of ensuring the support strength of the terminal portion by the metal supporting substrate.

The present invention [8] includes the wiring circuit board described in the above-described [6], wherein the second opening peripheral edge includes a fourth portion disposed outside the terminal portion and extends along the first portion in the projected view.

Such a configuration is preferable from the viewpoint of ensuring the wide opening space of the opening portion.

The present invention [9] includes the wiring circuit board described in any one of the above-described [1] to [8], wherein the conductive layer includes a plurality of terminal portions, and the opening portion faces the plurality of terminal portions through the insulating layer.

Such a configuration is preferable from the viewpoint of high density of arrangement of the terminal portions.

The present invention [10] includes the wiring circuit board described in any one of the above-described [1] to [9], wherein the opening portion has a curved wall surface disposed between the first opening peripheral edge and the second opening peripheral edge and curving so as to bulge outwardly.

Such a configuration is suitable for ensuring the wide opening space of the opening portion.

The present invention [11] includes the wiring circuit board described in any one of the above-described [1] to [10], wherein a separation distance between the first opening peripheral edge and the second opening peripheral edge in the projected view is 20 μm or more and 120 μm or less.

Such a configuration is suitable for both ensuring the support strength with respect to the terminal portion and adjusting the characteristic impedance of the terminal portion.

The present invention [12] includes the wiring circuit board described in any one of the above-described [1] to [11], wherein the metal supporting substrate has a thickness of 20 μm or more and 250 μm or less.

Such a configuration is suitable for both strength and flexibility in the metal supporting substrate.

BRIEF DESCRIPTION OF THE DRAWINGS

FIGS. 5A to 5D show one example of a method for producing the wiring circuit board shown in FIG. 1:

FIG. 5A illustrating a base insulating layer forming step,

FIG. 5B illustrating a conductive layer forming step,

FIG. 5C illustrating a cover insulating layer forming step, and

FIG. 5D illustrating an opening portion forming step.

DESCRIPTION OF EMBODIMENTS

Figure 1:
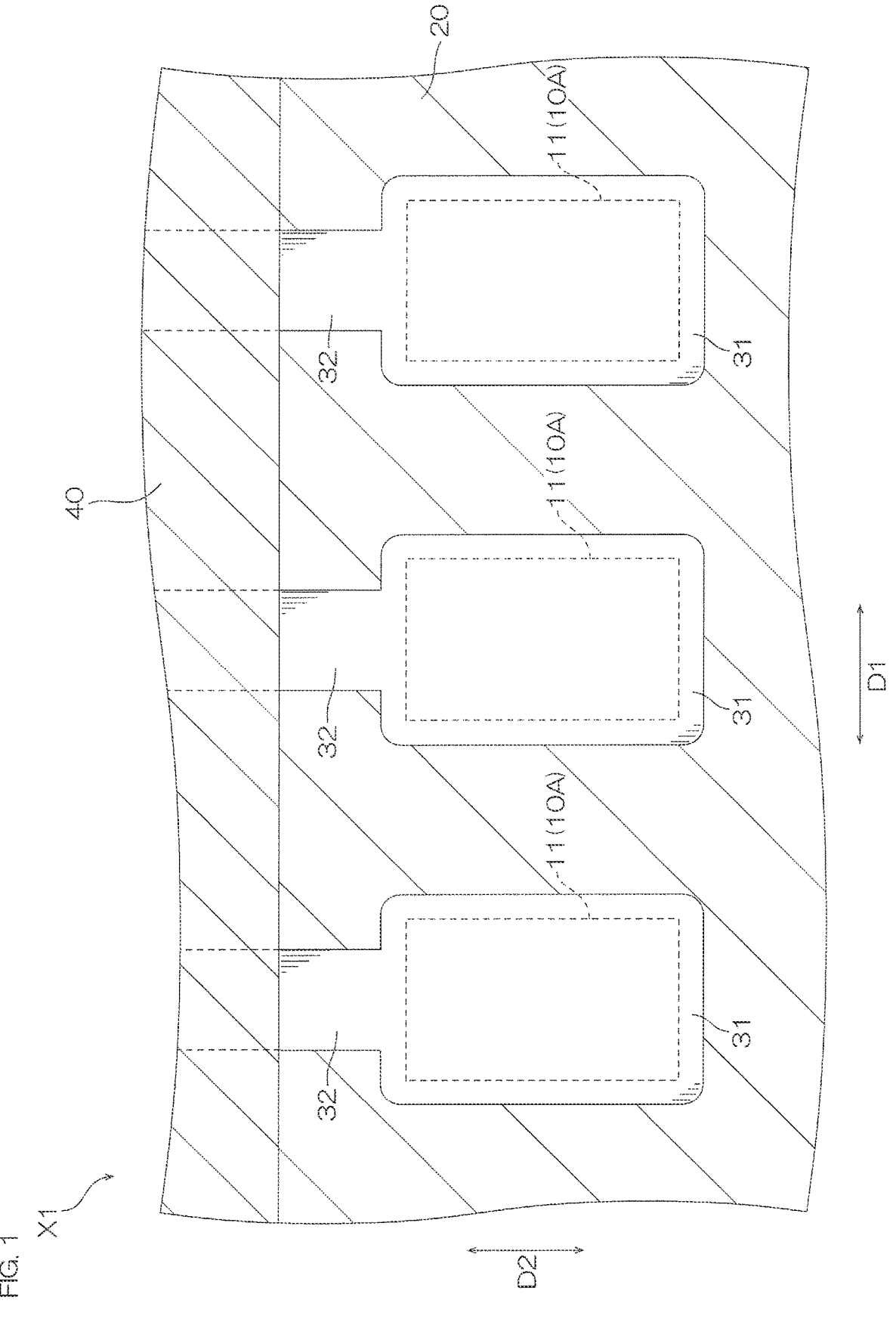
FIG. 1 shows a partially plan view of a first embodiment of a wiring circuit board of the present invention.

As shown in FIGS. 1 to 4, a wiring circuit board X1 as a first embodiment of a wiring circuit board of the present invention includes a metal supporting substrate 10, an insulating layer 20 as a base insulating layer, a conductive layer 30, and an insulating layer 40 as a cover insulating layer in this order toward one side in a thickness direction T. The wiring circuit board X1 extends in a direction, plane direction, perpendicular to the thickness direction T, and has a predetermined shape when viewed from the top.

The metal supporting substrate 10 is a substrate for ensuring strength of the wiring circuit board X1. Examples of a material for the metal supporting substrate 10 include stainless steel, copper, copper alloy, aluminum, nickel, titanium, and 42-alloy. An example of the stainless steel includes SUS304 based on standards of AISI (American Iron and Steel Institute). From the viewpoint of the strength of the metal supporting substrate 10, the metal supporting substrate 10 preferably includes at least one selected from the group consisting of stainless steel, copper alloy, aluminum, nickel, and titanium, and is more preferably made of at least one selected from the group consisting of stainless steel, copper alloy, aluminum, nickel, and titanium. From the viewpoint of both the strength and electrical conductivity of the metal supporting substrate 10, the metal supporting substrate 10 is preferably made of a copper alloy.

The metal supporting substrate 10 has opening portions 10A. Each of the opening portions 10A is formed corresponding to each of terminal portions 31 to be described later. The opening portion 10A is described in detail later.

A thickness of the metal supporting substrate 10 is preferably 20 μm or more, more preferably 30 μm or more, further more preferably 40 μm or more, particularly preferably 50 μm or more, especially preferably 60 μm or more. Such a configuration is preferable from the viewpoint of ensuring the strength of the metal supporting substrate 10. The thickness of the metal supporting substrate 10 is preferably 250 μm or less, more preferably 200 μm or less. Such a configuration is preferable from the viewpoint of ensuring flexibility of the metal supporting substrate 10.

The insulating layer 20 is disposed on one side in the thickness direction T of the metal supporting substrate 10. In the embodiment, the insulating layer 20 is disposed on one surface in the thickness direction T of the metal supporting substrate 10. Examples of the material for the insulating layer 20 include resin materials such as polyimide, polyether nitrile, polyether sulfone, polyethylene terephthalate, polyethylene naphthalate, and polyvinyl chloride (as the material for the insulating layer 40 to be described later, the same resin material is used). The thickness of the insulating layer 20 is preferably 1 μm or more, more preferably 3 μm or more, and preferably 35 μm or less, more preferably 20 μm or less.

The conductive layer 30 is disposed on one side in the thickness direction T of the metal supporting substrate 10. In the embodiment, the conductive layer 30 is disposed on one surface in the thickness direction T of the metal supporting substrate 10. Examples of the material for the conductive layer 30 include copper, nickel, gold, and alloys of these, and preferably, copper is used. The thickness of the conductive layer 30 is, for example, 1 μm or more, preferably 3 μm or more. The thickness of the conductive layer 30 is, for example, 50 μm or less, preferably 30 μm or less.

The conductive layer 30 includes the terminal portions 31 and wiring portions 32. A case where the three terminal portions 31 are disposed in a row spaced apart in a first direction D1, and the wiring portions 32 extend from one side in a second direction D2 (perpendicular to the first direction D1) of the terminal portion 31 is illustratively shown.

Examples of a shape of the terminal portion 31 when viewed from the top include circular shapes, rectangular shapes, and rounded rectangular shapes. Examples of the rectangular shape include square shapes and oblong shapes. Examples of the rounded rectangular shape include rounded square shapes and rounded oblong shapes (illustratively showing a case where the shape of the terminal portion 31 when viewed from the top is a rounded oblong shape). A length L1 (length in the first direction D1 of the terminal portion 31) shown in FIG. 2 of the terminal portion 31 is, for example, 10 to 1000 μm. A length L2 (length in the second direction D2 of the terminal portion 31) shown in FIG. 2 of the terminal portion 31 is, for example, 10 to 1000 μm.

The wiring portion 32 has a predetermined pattern shape (not shown) on the insulating layer 20. One end of the wiring portion 32 is connected to the one terminal portion 31 (in FIGS. 1 and 2, a portion covered with the insulating layer 40 to be described later in the wiring portion 32 is shown by a broken line). The other end of the wiring portion 32 is, for example, connected to another terminal portion 31 which is not shown. A width of the wiring portion 32 (dimension in a direction perpendicular to an extending direction of the wiring portion 32) is, for example, 5 μm or more, preferably 8 μm or more, and for example, 100 μm or less, preferably 50 μm or less.

The insulating layer 40 is disposed on one side in the thickness direction T of the insulating layer 20 so as to cover apart of the conductive layer 30. In the embodiment, the insulating layer 40 is disposed on one surface in the thickness direction T of the insulating layer 20 so as to cover a part of the wiring portion 32. The thickness of the insulating layer 40 on the insulating layer 20 or on the wiring portion 32 is preferably 2 μm or more, more preferably 4 μm or more, and preferably 60 μm or less, more preferably 40 μm or less.

In the metal supporting substrate 10, the opening portion 10A penetrates, or passes through, the metal supporting substrate 10 in the thickness direction T. The opening portion 10A faces the one terminal portion 31 through the insulating layer 20. Examples of the shape of the opening portion 10A when viewed from the top include circular shapes, rectangular shapes, and rounded rectangular shapes. Examples of the rectangular shape include square shapes and oblong shapes (illustratively showing a case where the shape of the opening portion 10A when viewed from the top is an oblong shape). Examples of the rounded rectangular shape include rounded square shapes and rounded oblong shapes. The opening portion 10A preferably has generally the same shape as the terminal portion 31 when viewed from the top.

Figure 3:
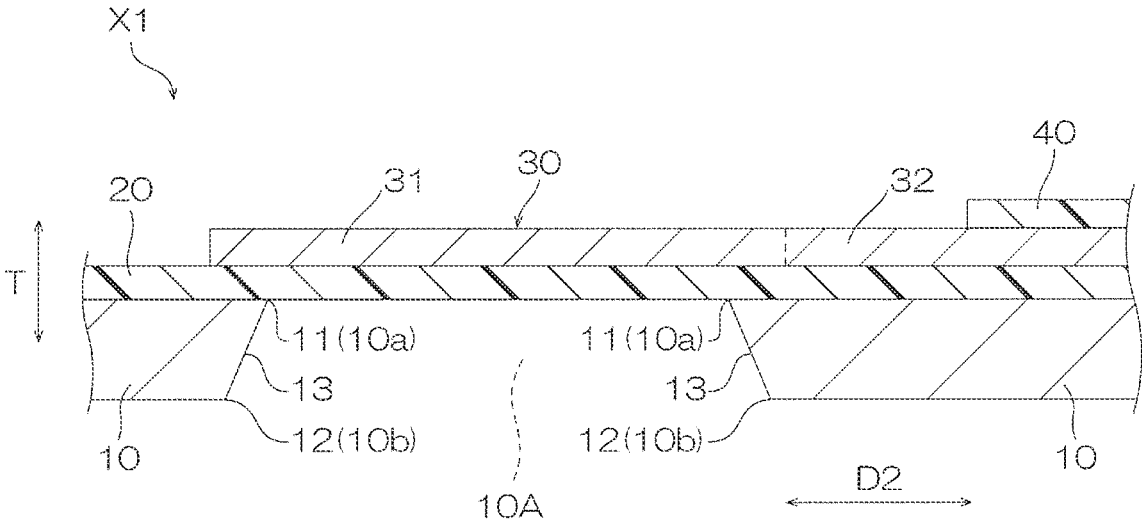
FIG. 3 shows a cross-sectional view along a III-III line of FIG. 2.
Figure 4:
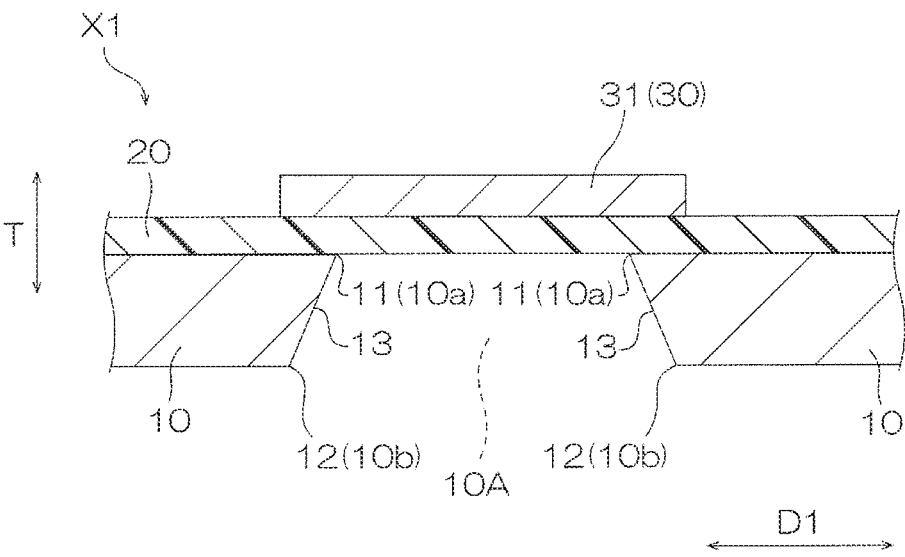
FIG. 4 shows a cross-sectional view along a IV-IV line of FIG. 2.

The opening portion 10A has a first opening peripheral edge 11 on one side in the thickness direction T, a second opening peripheral edge 12 on the other side in the thickness direction T, and an inner wall surface 13 between the first opening peripheral edge 11 and the second opening peripheral edge 12. As shown in FIGS. 3 and 4, the first opening peripheral edge 11 defines a first opening end 10a on one side, the insulating layer 20-side, in the thickness direction T in the opening portion 10A. The second opening peripheral edge 12 defines a second opening end 10b on the other side in the thickness direction T in the opening portion 10A.

Figure 2:
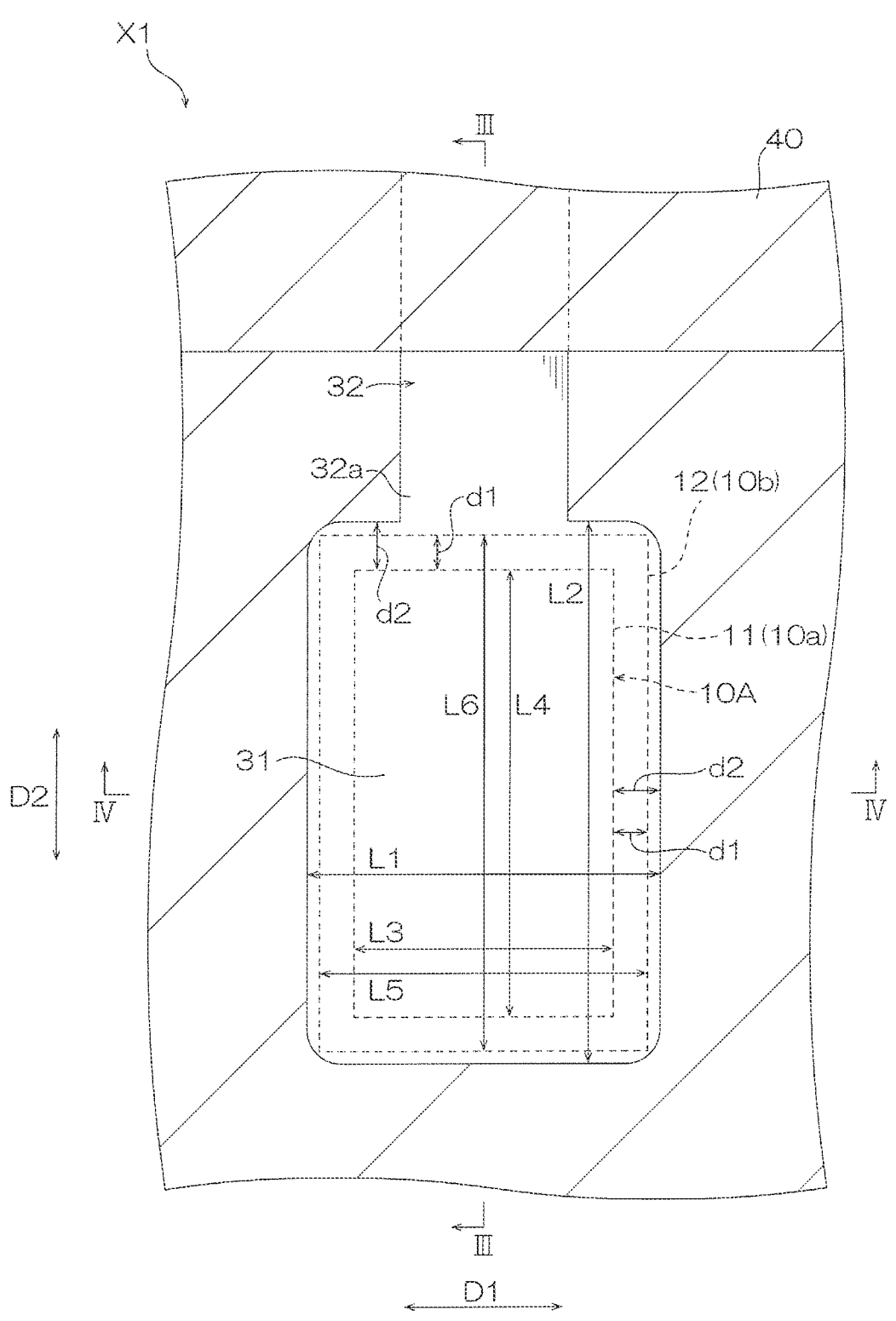
FIG. 2 shows a plan view of a terminal portion and its vicinity of the wiring circuit board shown in FIG. 1.

As shown in FIG. 2, in the projected view in the thickness direction T, the second opening peripheral edge 12 is disposed outside the first opening peripheral edge 11, and extends along the first opening peripheral edge 11. In the opening portion 10A, the opening area of the first opening end 10a is relatively small, and the opening area of the second opening end 10b is relatively large. In the embodiment, as shown in FIGS. 3 and 4, the inner wall surface 13 is inclined so that the cross-sectional area of the opening portion 10A is gradually increased from the first opening peripheral edge 11 toward the second opening peripheral edge 12. Further, a separation distance d1 (shown in FIG. 2) between the first opening peripheral edge 11 and the second opening peripheral edge 12 in the above-described projected view is preferably 20 μm or more, more preferably 30 μm or more, further more preferably 40 μm or more. The separation distance d1 is preferably 120 μm or less, more preferably 110 μm or less, further more preferably 100 μm or less.

In the embodiment, in the projected view in the thickness direction T, the entire first opening peripheral edge 11 is disposed inside the terminal portion 31, and the entire second opening peripheral edge 12 is disposed inside the terminal portion 31. Such a configuration is preferable from the viewpoint of ensuring support strength of the terminal portion 31 by the metal supporting substrate 10.

In the embodiment, a separation distance d2 (shown in FIG. 2) between the end edge of the terminal portion 31 and the first opening peripheral edge 11 in the above-described projected view is preferably 5 μm or more, more preferably 10 μm or more. The separation distance d2 is preferably 400 μm or less, more preferably 300 μm or less. A ratio of a length L3 (length in the first direction D1) shown in FIG. 2 of the first opening end 10a to the length L1 of the terminal portion 31 is preferably 0.3 or more and 0.98 or less. The ratio of a length L4 (length in the second direction D2) shown in FIG. 2 of the first opening end 10a to the length L2 of the terminal portion 31 is preferably 0.3 or more and 0.98 or less. The ratio of a length L5 (length in the first direction D1) shown in FIG. 2 of the second opening end 10b to the length L1 is preferably 0.31 or more and 0.99 or less. The ratio of a length L6 (length in the second direction D2) shown in FIG. 2 of the second opening end 10b to the length L2 is preferably 0.31 or more and 0.99 or less.

FIGS. 5A to 5D show one example of a method for producing the wiring circuit board X1. FIGS. 5A to 5D show the production method as a change in a cross section corresponding to FIG. 2.

In the production method, first, as shown in FIG. 5A, the insulating layer 20 is formed on one surface in the thickness direction T of the metal supporting substrate 10 (base insulating layer forming step). In this step, for example, the insulating layer 20 is formed as follows. First, a solution (varnish) of a photosensitive resin is applied onto the metal supporting substrate 10, thereby forming a coating film. Next, the coating film is dried by heating. Next, the coating film is subjected to an exposure process through a predetermined mask, a subsequent development process, and thereafter, a bake process as necessary. For example, as described above, the insulating layer 20 can be formed on the metal supporting substrate 10.

Next, as shown in FIG. 5B, the conductive layer 30 is formed on the insulating layer 20 (conductive layer forming step). In this step, first, a seed layer (not shown) is formed on the insulating layer 20 by, for example, a sputtering method. Examples of the material for the seed layer include Cr, Cu, Ni, Ti, and alloys of these. The seed layer may have a single layer structure or may have a two or more multilayer structure. When the seed layer has a multilayer structure, the seed layer consists of, for example, a chromium layer as a lower layer and a copper layer on the chromium layer. Next, a resist pattern is formed on the seed layer. The resist pattern has an opening portion having a shape corresponding to a pattern shape of the conductive layer 30. In forming the resist pattern, for example, a photosensitive resist film is attached onto the seed layer, thereby forming a resist film. Thereafter, the resist film is subjected to the exposure process through the predetermined mask, the subsequent development process, and thereafter, the bake process as necessary. In forming the conductive layer 30, next, the above-described metal is grown on the seed layer in the opening portion of the resist pattern by, for example, electrolytic plating. Next, the resist pattern is removed by etching. Next, a portion exposed by the resist pattern removal in the seed layer is removed by etching. For example, as described above, the conductive layer 30 in a predetermined pattern (the terminal portion 31, the wiring portion 32) can be formed.

Next, as shown in FIG. 5C, the insulating layer 40 is formed on the insulating layer 20 so as to cover a part of the conductive layer 30 (cover insulating layer forming step). In this step, for example, the insulating layer 40 is formed as follows. First, the solution (varnish) of the photosensitive resin is applied onto the insulating layer 20 and the conductive laver 30, thereby forming the coating film. Next, the coating film is dried. Next, the coating film is subjected to the exposure process through the predetermined mask, the subsequent development process, and thereafter, the bake process as necessary. For example, as described above, the insulating layer 40 can be formed.

Next, as shown in FIG. 5D, the opening portion 10A is formed in the metal supporting substrate 10 (opening portion forming step). In this step, first, a resist pattern is formed on the other surface in the thickness direction T of the metal supporting substrate 10. The resist pattern has an opening portion in a shape corresponding to the shape of the second opening peripheral edge 12 of the opening portion 10A described above. In forming the resist pattern, for example, the photosensitive resist film is attached onto the other surface of the metal supporting substrate 10, thereby forming the resist film. Thereafter, the resist film is subjected to the exposure process through the predetermined mask, the subsequent development process, and thereafter, the bake process as necessary. In forming the opening portion 10A, next, the metal supporting substrate 10 is subjected to wet etching from the other side in the thickness direction T by using the resist pattern as an etching mask (etching process). Examples of an etchant for the wet etching include ferric chloride aqueous solutions and cupric chloride aqueous solutions. The concentration of the etchant is, for example, 30 to 55% by mass. A temperature of the etchant is, for example, 20° C. to 55° C. The etching time is, for example, 1 to 15 minutes.

In this step, forming of the opening portion 10A in the metal supporting substrate 10 and the outer shape processing thereof are simultaneously carried out by the above-described etching process as necessary.

As described above, the wiring circuit board X1 can be produced.

In the wiring circuit board X1, as described above, the opening portion 10A facing the terminal portion 31 through the insulating layer 20 is formed in the metal supporting substrate 10. Such a configuration is suitable for adjusting characteristic impedance of the terminal portion 31. In addition, in the projected view in the thickness direction T of the wiring circuit board X1, the second opening peripheral edge 12 of the opening portion 10A is disposed outside the first opening peripheral edge 11, and extends along the first opening peripheral edge 11. That is, in the opening portion 10A, the first opening area of the end portion on one side, terminal portion-side, in the thickness direction T is relatively small, and the second opening area of the end portion on the other side in the thickness direction T is relatively large. Such a configuration is suitable for adjusting the characteristic impedance of the terminal portion 31 by ensuring wide opening space of the opening portion 10A, while suppressing a decrease in the support strength of the terminal portion 31 by the metal supporting substrate 10. Therefore, the wiring circuit board X1 is suitable for adjusting the characteristic impedance of the terminal portion 31 while ensuring the support strength with respect to the terminal portion 13. Such a technical effect is also obtained in modified examples to be described later and a second embodiment.

In the wiring circuit board X1, as shown in FIGS. 2 and 3, an end portion 32a which is connected to the terminal portion 31 in the wiring portion 32 is not located above the first opening end 10a of the opening portion 10A, and is located above the metal supporting substrate 10 in the projected view in the thickness direction T. In a mounting step of an external component (not shown) with respect to the wiring circuit board X1, such a configuration is suitable for preventing the end portion 32a of the wiring portion 31 from breaking when terminals of the external component are connected to the terminal portion 31. Such a technical effect is also obtained from the modified examples to be described later shown in FIGS. 8 to 10, the modified examples to be described later shown in FIGS. 14 to 16, the modified example to be described later shown in FIG. 17, the modified example to be described later shown in FIG. 18, the modified examples to be described later shown in FIGS. 25 to 27, the modified example to be described later shown in FIG. 28, and the modified example to be described later shown in FIG. 29.

Figure 6:
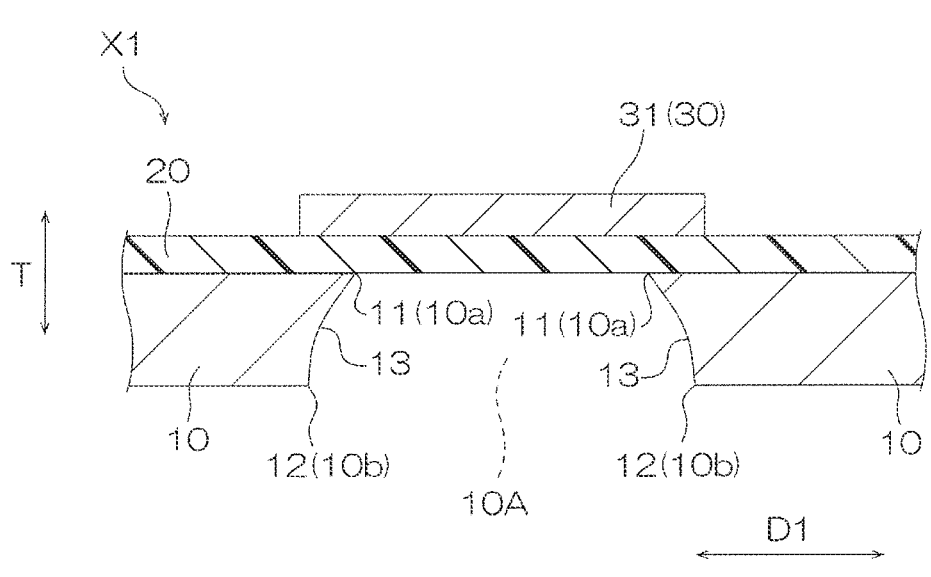
FIG. 6 shows a partially cross-sectional view of a modified example of the wiring circuit board shown in FIG. 1, and in the modified example, an opening portion of a metal supporting substrate has a shape bulging outwardly in a longitudinal cross-sectional view.

In the metal supporting substrate 10 of the wiring circuit board X1, as shown in FIG. 6, the opening portion 10A may have a shape bulging outwardly in a longitudinal cross-sectional view. That is, the inner wall surface 13 of the opening portion 10A may be a curved wall surface (curved surface) curving outwardly (center of curvature of the curved surface is located inside the opening portion 10A). Such a configuration is suitable for ensuring the wide opening space of the opening portion 10A while suppressing the area of the first opening end 10a of the opening portion 10A.

To form the opening portion 10A, the ferric chloride aqueous solution is preferably used as the etchant in the above-described wet etching with reference to FIG. 5D. The concentration of the etchant is preferably 30% by mass or more, more preferably 32% by mass or more. The concentration of the etchant is preferably 55% by mass or less, more preferably 53% by mass or less. The lower the concentration of the etchant, the easier to widen the above-described separation distance d1 between the first opening peripheral edge 11 and the second opening peripheral edge 12 in the projected view in the thickness direction T. The temperature of the etchant is preferably 20° C. or more, more preferably 25° C. or more, further more preferably 30° C. or more. The temperature of the etchant is preferably 80° C. or less, more preferably 75° C. or less. The higher the temperature of the etchant, the easier to curve the inner wall surface 13 (the easier to decrease the radius of curvature of the inner wall surface 13). The etching time is preferably 1 minute or more, more preferably 2 minutes or more. The etching time is preferably 15 minutes or less, more preferably 12 minutes or less.

Figure 7:
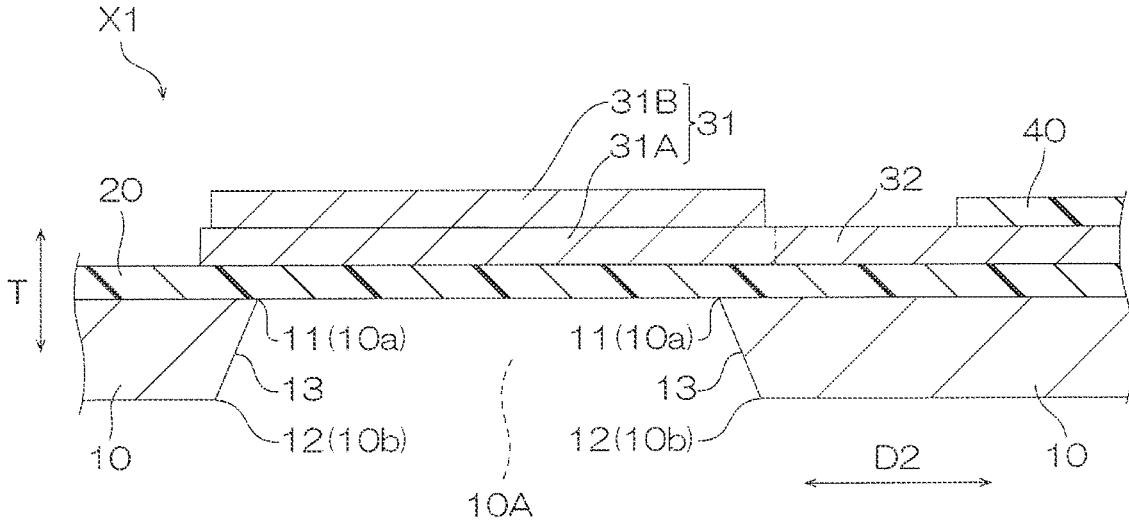
FIG. 7 shows a partially cross-sectional view of a modified example of the wiring circuit board shown in FIG. 1, and in the modified example, a terminal portion has a two-layer structure.

As shown in FIG. 7, the terminal portion 31 in the wiring circuit board X1 may also have a two-layer structure. The terminal portion 31 shown in FIG. 7 specifically includes a first conductive layer 31A on the insulating layer 20-side, and a second conductive layer 31B on the first conductive layer 31A.

The first conductive layer 31A is the same as the above-described terminal portion 31 with reference to FIGS. 1 to 4. The second conductive layer 31B has an outer shape which fits within the outer shape of the first conductive layer 31A when viewed from the top. The thickness of the second conductive layer 31B is, for example, 1 μm or more, preferably 3 μm or more. The thickness of the second conductive layer 31B is, for example, 50 μm or less, preferably 30 μm or less. As the material for the second conductive layer 31B, the above-described materials for the conductive layer 30 are used. The material for the first conductive layer 31A and the material for the second conductive layer 31B are preferably the same, more preferably copper. The material for the first conductive layer 31A and the material for the second conductive layer 31B may be different.

The wiring circuit board X1 including the terminal portion 31 shown in FIG. 7 can be, for example, produced in the same manner as the above-described method for producing the wiring circuit board X1, except that the second conductive layer 31B is pattern-formed on the conductive layer 30 between the conductive layer forming step (FIG. 5B) and the cover insulating layer forming step (FIG. 5C).

It is preferable that the terminal portion 31 has a two-layer structure from the viewpoint of ensuring the strength of the terminal portion 31. Similarly, the modified examples and the second embodiment to be described later may also have the terminal portion 31 having a two-layer structure.

Figure 8:
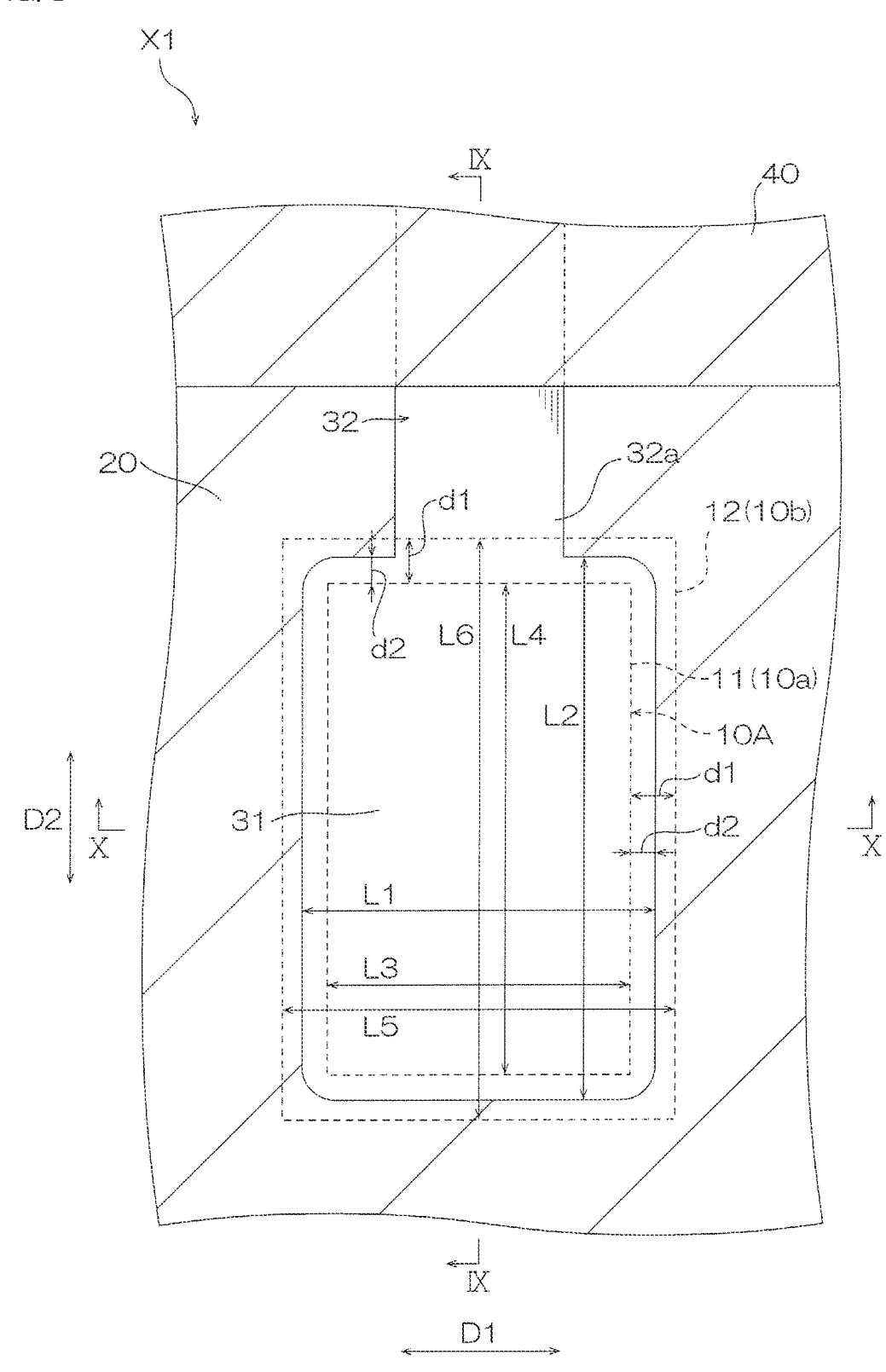
FIG. 8 shows a partially plan view of a modified example of the wiring circuit board shown in FIG. 1, and in the modified example, in a projected view in a thickness direction, an entire first opening peripheral edge of an opening portion of a metal supporting substrate is disposed inside a terminal portion, and an entire second opening peripheral edge of the opening portion is disposed outside the terminal portion.
Figure 9:
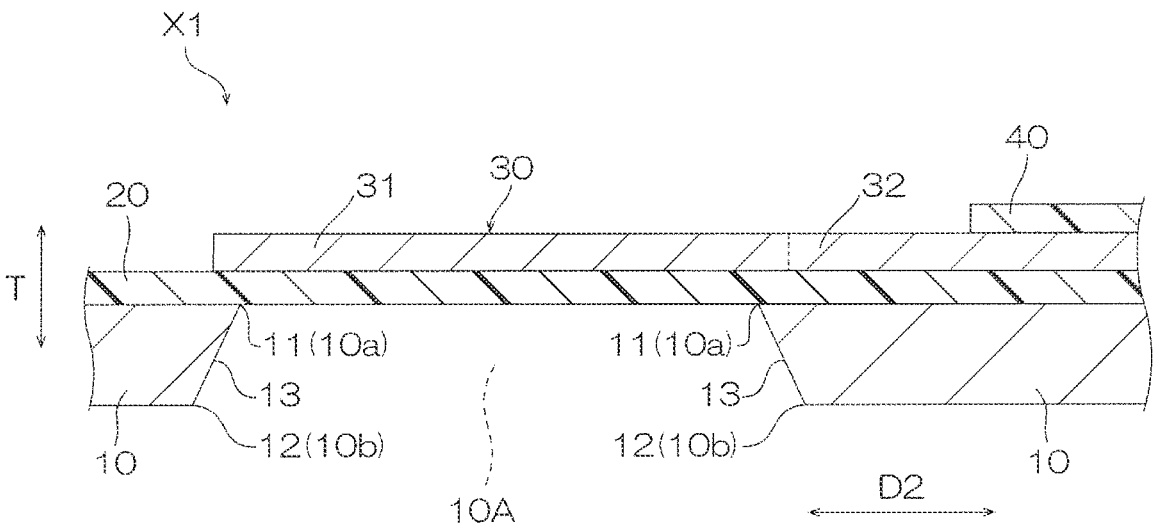
FIG. 9 shows a cross-sectional view along a IX-IX line of FIG. 8.
Figure 10:
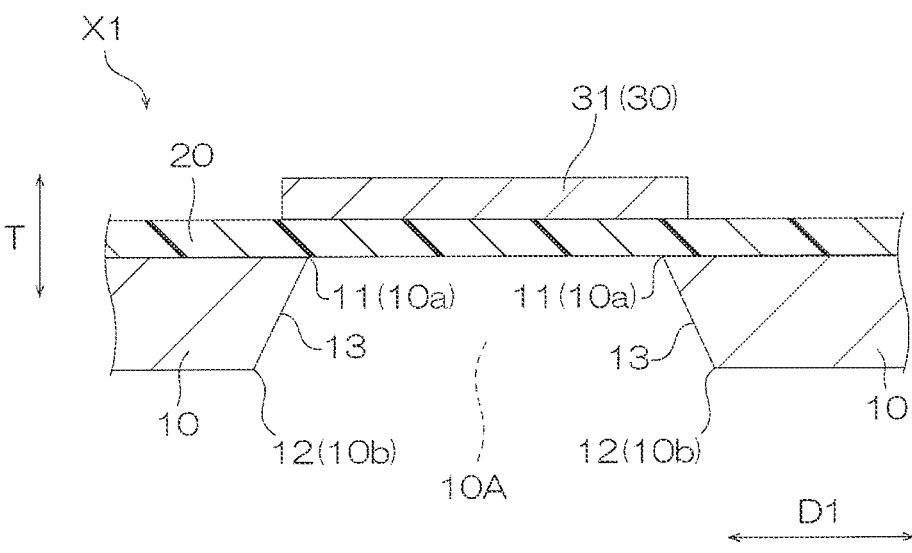
FIG. 10 shows a cross-sectional view along a X-X line of FIG. 8.

In the wiring circuit board X1, as shown in FIGS. 8 to 10, in the projected view in the thickness direction T, the entire first opening peripheral edge 11 of the opening portion 10A may be also disposed inside the terminal portion 31, and the entire second opening peripheral edge 12 may be also disposed outside the terminal portion 31. Such a configuration is preferable from the viewpoint of ensuring the wide opening space of the opening portion 10A.

In the modified example, the ratio of the length L3 shown in FIG. 8 of the first opening end 10a to the length L1 of the terminal portion 31 is preferably 0.4 or more and 0.98 or less. The ratio of the length L4 shown in FIG. 8 of the first opening end 10a to the length L2 of the terminal portion 31 is preferably 0.4 or more and 0.98 or less. The ratio of the length L5 shown in FIG. 8 of the second opening end 10b to the length L1 is preferably 1.01 or more and 3 or less. The ratio of the length L6 shown in FIG. 8 of the second opening end 10b to the length L2 is preferably 1.01 or more and 3 or less.

Figure 11:
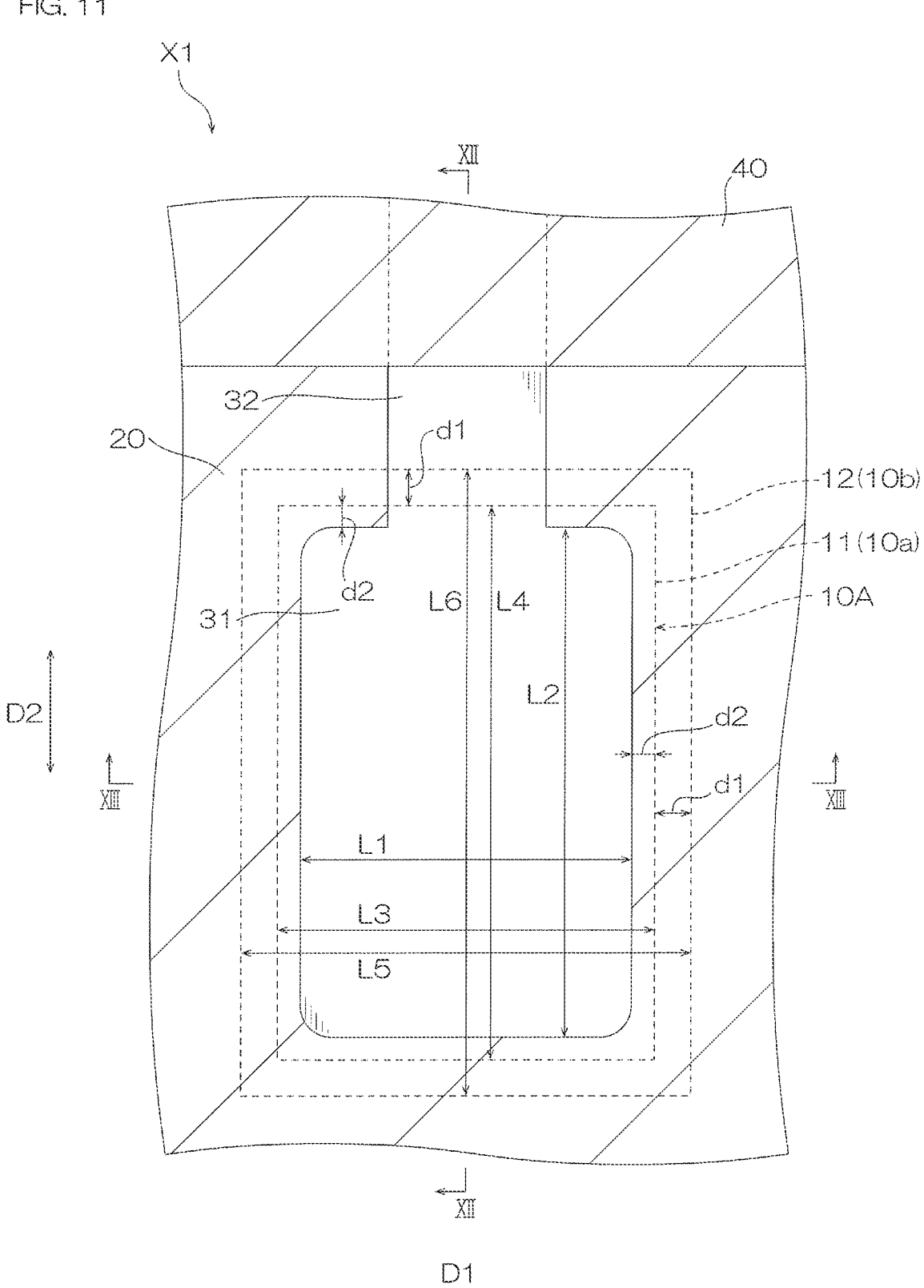
FIG. 11 shows a partially plan view of a modified example of the wiring circuit board shown in FIG. 1, and in the modified example, in a projected view in a thickness direction, an entire first opening peripheral edge and an entire second opening peripheral edge of an opening portion of a metal supporting substrate are disposed outside a terminal portion.
Figure 12:
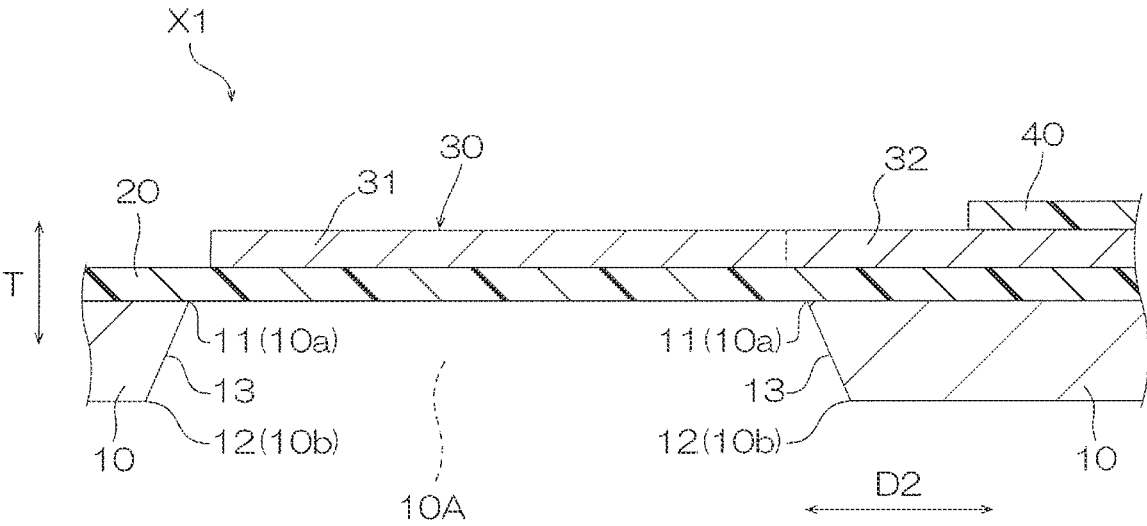
FIG. 12 shows a cross-sectional view along a XII-XII line of FIG. 11.
Figure 13:
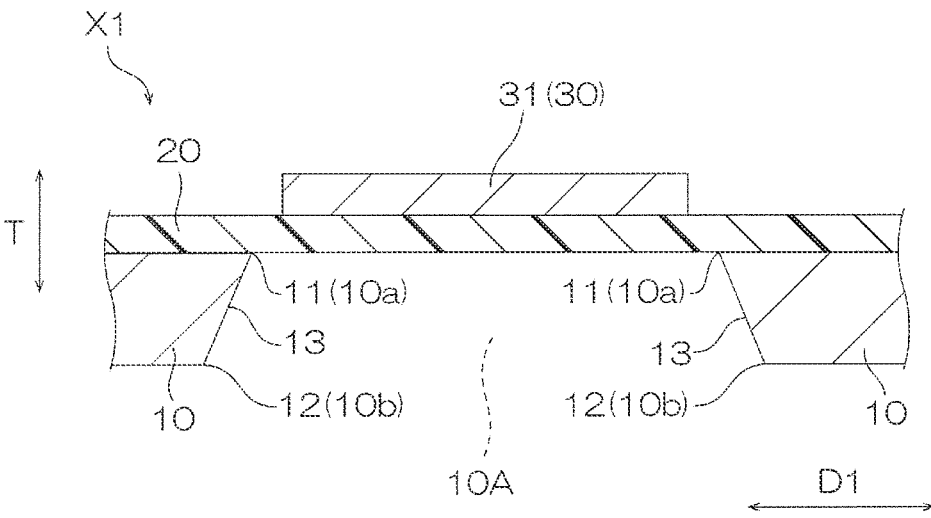
FIG. 13 shows a cross-sectional view along a XIII-XIII line of FIG. 11.

In the wiring circuit board X1, as shown in FIGS. 11 to 13, in the projected view in the thickness direction T, the entire first opening peripheral edge 11 and the entire second opening peripheral edge 12 in the opening portion 10A may be also disposed outside the terminal portion 31. Such a configuration is preferable from the viewpoint of ensuring the wide opening space of the opening portion 10A.

In the modified example, the separation distance d2 (shown in FIG. 11) between the end edge of the terminal portion 31 and the first opening peripheral edge 11 in the above-described projected view is preferably 5 μm or more, more preferably 10 μm or more. The separation distance d2 is preferably 400 μm or less, more preferably 300 m or less. The ratio of the length L3 shown in FIG. 11 of the first opening end 10a to the length L1 of the terminal portion 31 is preferably 1.01 or more and 4 or less. The ratio of the length L4 shown in FIG. 11 of the first opening end 10a to the length L2 of the terminal portion 31 is preferably 1.01 or more and 4 or less. The ratio of the length L5 shown in FIG. 11 of the second opening end 10b to the length L1 is preferably 1.05 or more and 5 or less. The ratio of the length L6 shown in FIG. 11 of the second opening end 10b to the length L2 is preferably 1.05 or more and 5 or less.

Figure 14:
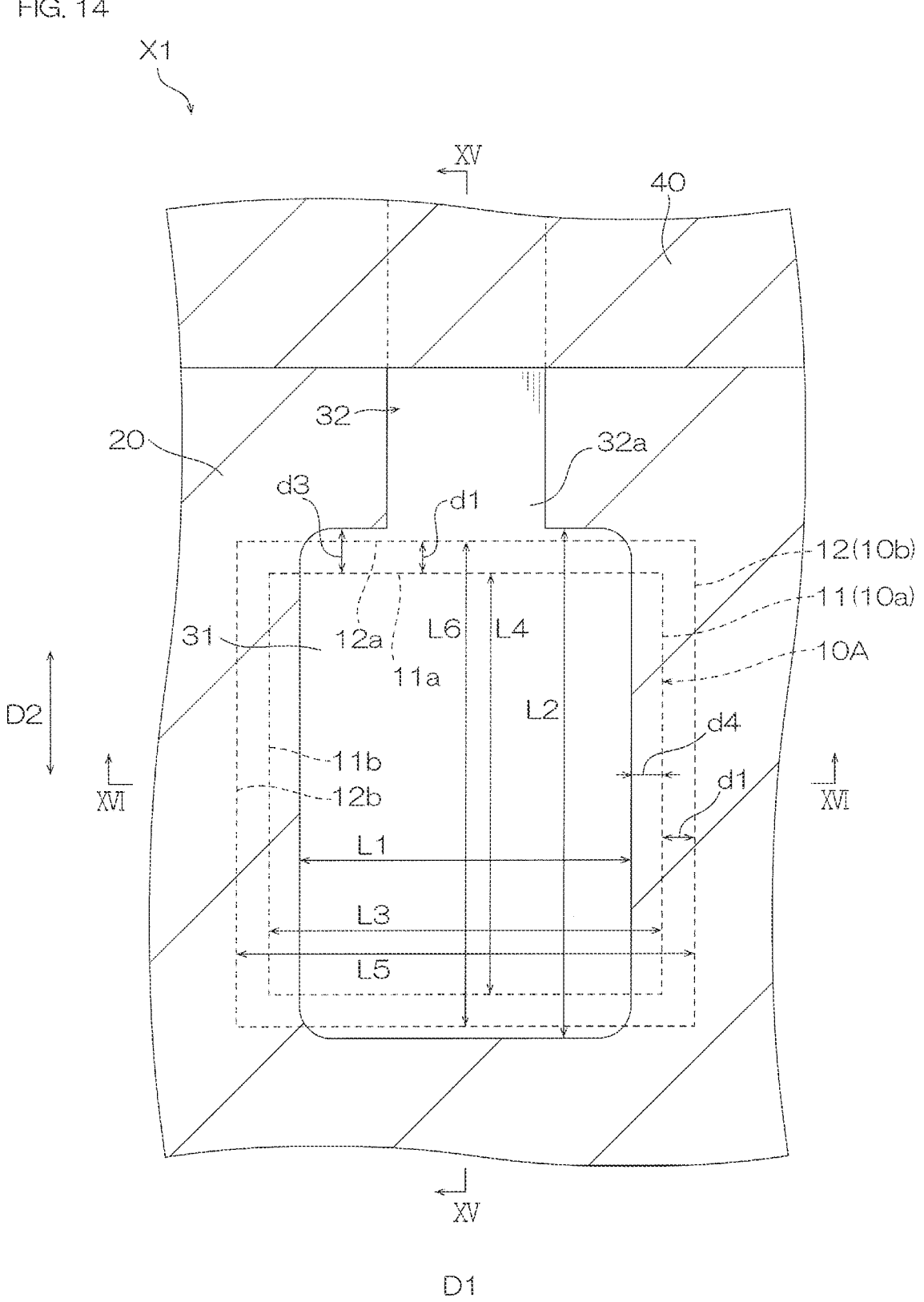
FIG. 14 shows a partially plan view of a modified example of the wiring circuit board shown in FIG. 1; in the modified example, a first opening peripheral edge of an opening portion of a metal supporting substrate includes a first portion disposed inside a terminal portion and a second portion disposed outside the terminal portion in a projected view in a thickness direction; and in the modified example, the first portion extends in a first direction.
Figure 15:
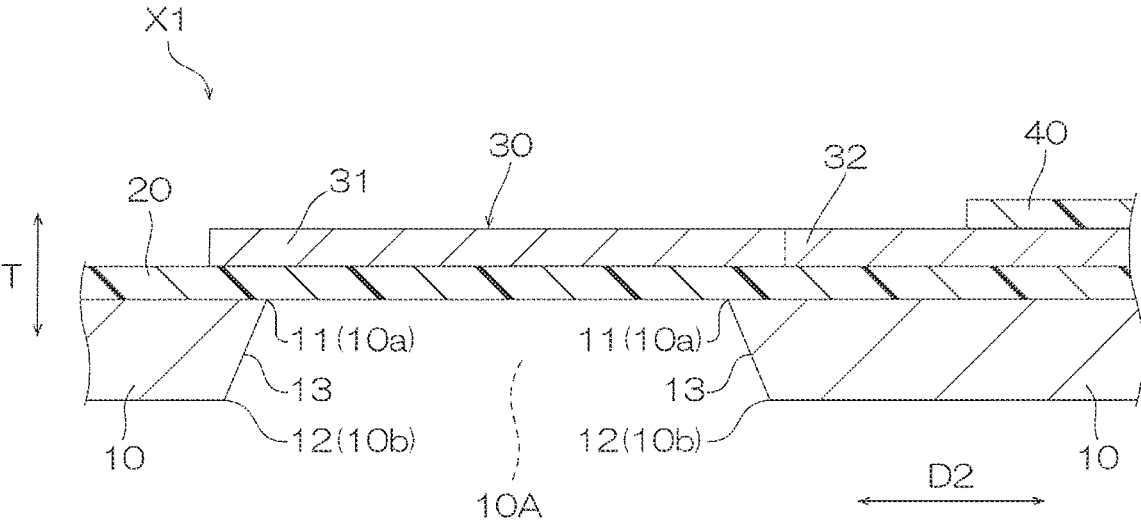
FIG. 15 shows a cross-sectional view along a XV-XV line of FIG. 14.
Figure 16:
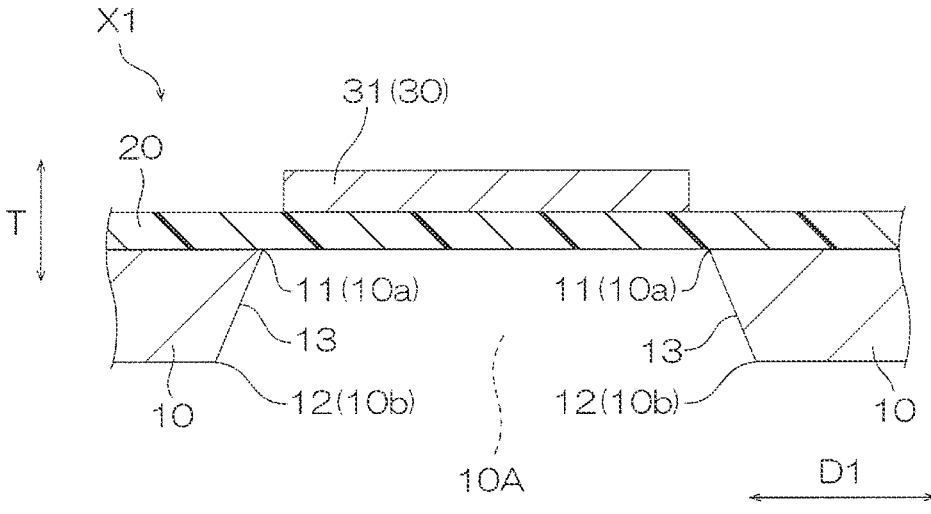
FIG. 16 shows a cross-sectional view along a XVI-XVI line of FIG. 14.

In the wiring circuit board X1, as shown in FIGS. 14 to 16, the first opening peripheral edge 11 of the opening portion 10A may include a portion 11a (first portion) and a portion 11b (second portion). In the projected view in the thickness direction T, the portion 11a is disposed inside the terminal portion 31, and the portion 11b is disposed outside the terminal portion 31. The portion 11a extends in the first direction D1. The portion 11b includes a portion extending in the second direction D2 and a portion extending in the first direction D1. In the projected view in the thickness direction T, the second opening peripheral edge 12 includes a portion 12a (third portion) disposed inside the terminal portion 31 and extending along the portion 11a, and a portion 12b disposed outside the terminal portion 31 and extending along the portion 11b. The second opening peripheral edge 12 may also include the portion 12a (fourth portion) disposed outside the terminal portion 31 and extending along the portion 11a, and the portion 12b disposed outside the terminal portion 31 and extending along the portion 11b. These configurations are preferable from the viewpoint of both ensuring the support strength of the terminal portion 31 by the metal supporting substrate 10 and ensuring the opening space of the opening portion 10A.

In the modified example, a separation distance d3 (shown in FIG. 14) between the end edge of the terminal portion 31 and the portion 11a in the above-described projected view is preferably 5 μm or more, more preferably 10 μm or more. The separation distance d3 is preferably 400 μm or less, more preferably 300 μm or less. A separation distance d4 (shown in FIG. 14) between the end edge of the terminal portion 31 and the portion 11b in the above-described projected view is preferably 5 μm or more, more preferably 10 μm or more. The separation distance d4 is preferably 400 μm or less, more preferably 300 μm or less. The ratio of the length L3 shown in FIG. 14 of the first opening end 10a to the length L1 of the terminal portion 31 is preferably 1.01 or more and 4 or less. The ratio of the length L4 shown in FIG. 14 of the first opening end 10a to the length L2 of the terminal portion 31 is preferably 0.31 or more and 0.99 or less. The ratio of the length L5 shown in FIG. 14 of the second opening end 10b to the length L1 is preferably 1.05 or more and 5 or less. The ratio of the length L6 shown in FIG. 14 of the second opening end 10b to the length L2 is preferably 0.31 or more and 0.99 or less.

Figure 17:
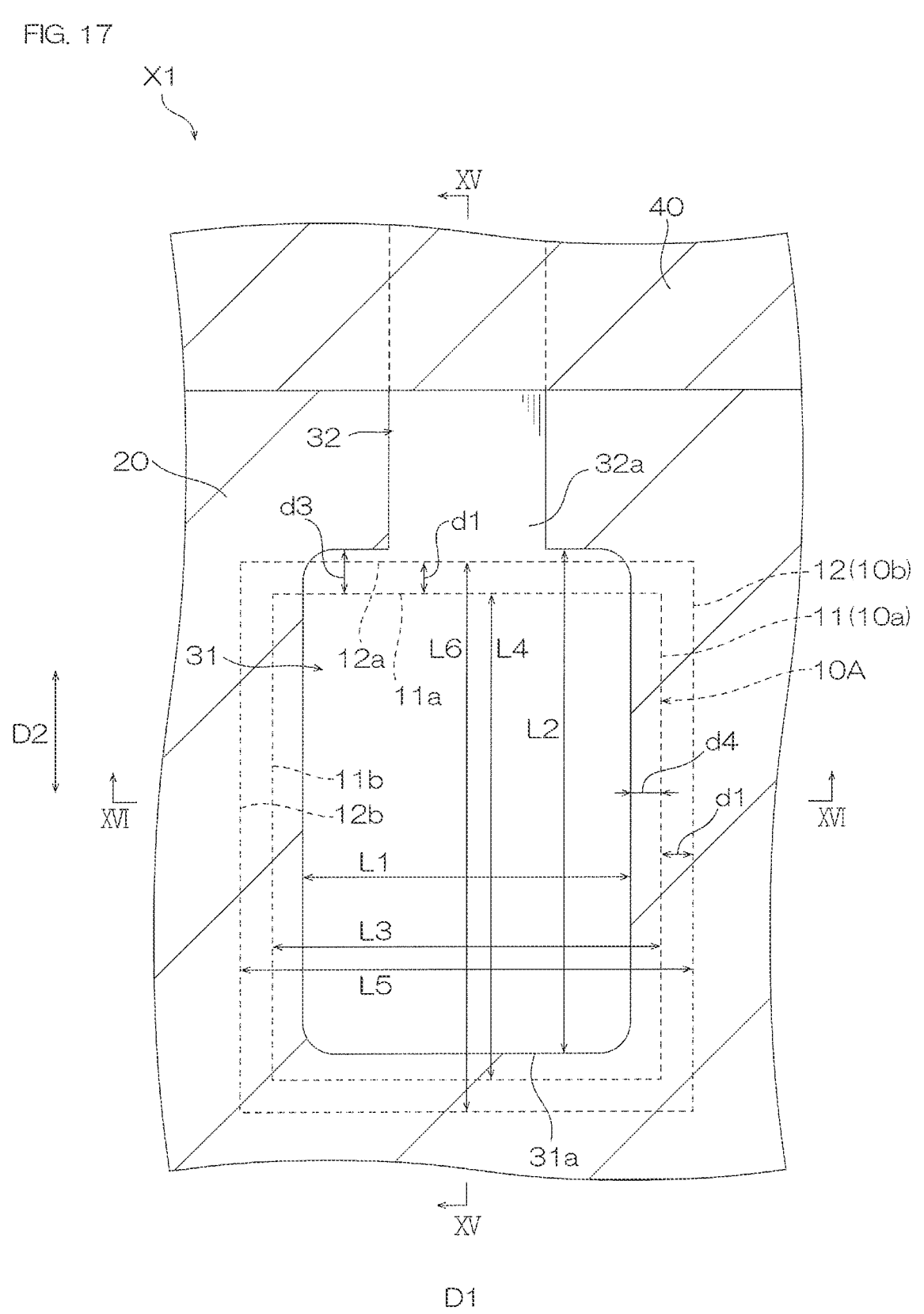
FIG. 17 shows a partially plan view of a modified example of the wiring circuit board shown in FIG. 1, and in the modified example, in comparison with the modified examples shown in FIGS. 14 to 16, an end portion on the opposite side to the wiring portion connection-side in the terminal portion is located above the opening portion in the projected view in the thickness direction.

In the above-described modified examples shown in FIGS. 14 to 16, as shown in FIG. 17, the end portion 31a on the opposite side to the wiring portion 32 connection-side in the terminal portion 31 may be located above the first opening end 10a of the opening portion 10A in the projected view in the thickness direction T.

Figure 18:
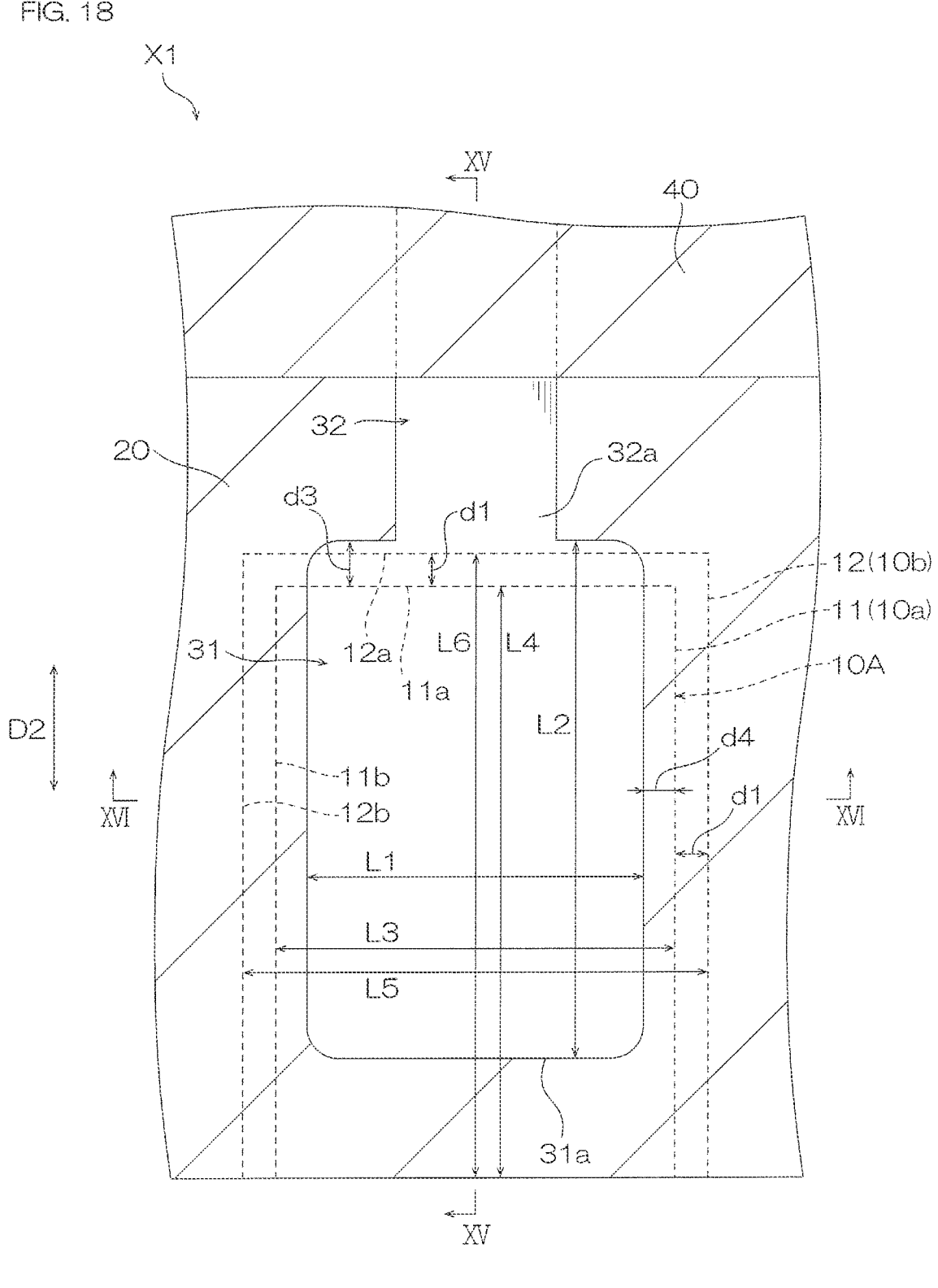
FIG. 18 shows a partially plan view of a modified example of the wiring circuit board shown in FIG. 1; in the modified example, in comparison with the modified examples shown in FIGS. 14 to 16, an end portion on the opposite side to the wiring portion connection-side in the terminal portion is located above the opening portion in the projected view in the thickness direction; and the opening portion has an opening in a plane direction.

In the modified example shown in FIG. 17, when the terminal portion 31 is formed near the end edge of the metal supporting substrate 10, as shown in FIG. 18, the opening portion 10A may open in the plane direction.

Figure 19:
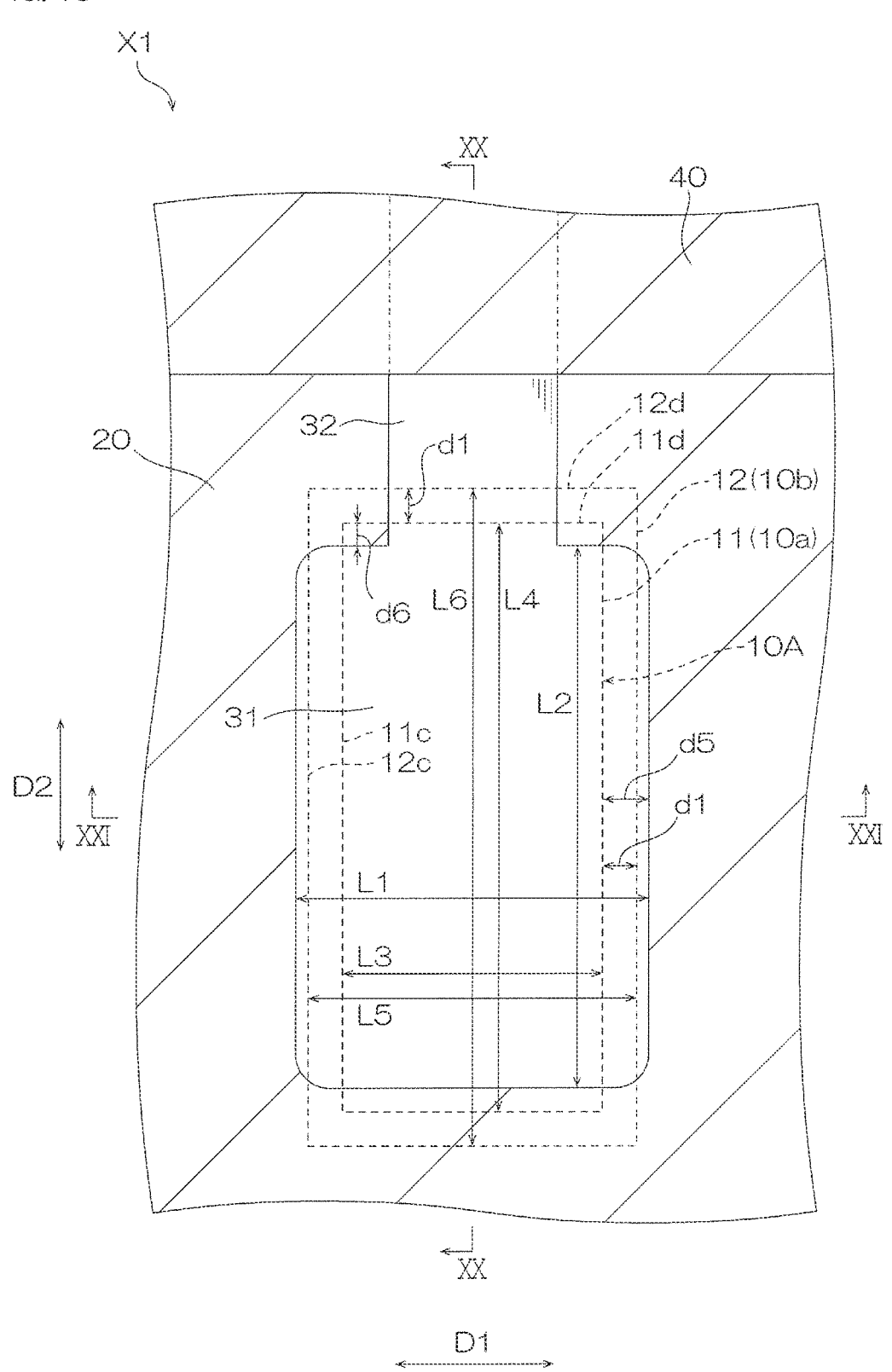
FIG. 19 shows a partially plan view of a modified example of the wiring circuit board shown in FIG. 1; in the modified example, a first opening peripheral edge of an opening portion of a metal supporting substrate includes a first portion disposed inside a terminal portion and a second portion disposed outside the terminal portion in a projected view in a thickness direction; and in the modified example, the first portion extends in a second direction.
Figure 20:
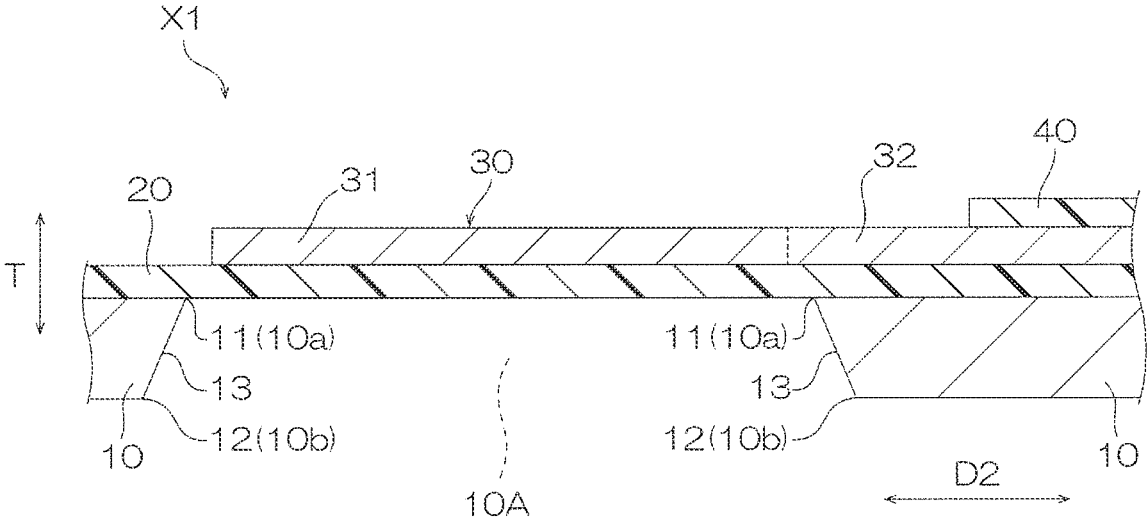
FIG. 20 shows a cross-sectional view along a XX-XX line of FIG. 19.
Figure 21:
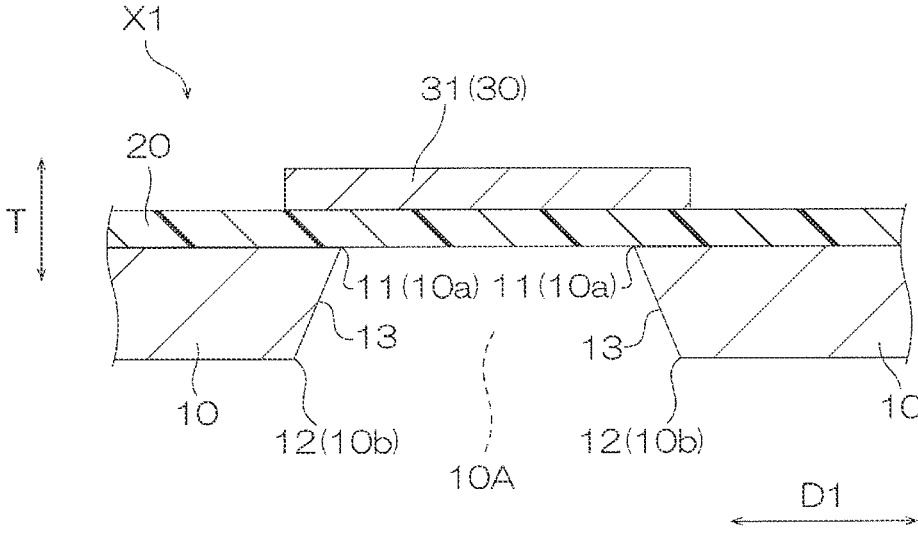
FIG. 21 shows a cross-sectional view along a XXI-XXI line of FIG. 19.

In the wiring circuit board X1, as shown in FIGS. 19 to 21, the first opening peripheral edge 11 of the opening portion 10A may include a portion 11c (first portion) and a portion 11d (second portion). In the projected view in the thickness direction T, the portion 11c is disposed inside the terminal portion 31, and the portion 11d is disposed outside the terminal portion 31. The portion 11c extends in the second direction D2. The portion 11d includes a portion extending in the first direction D1 and a portion extending in the second direction D2. In the projected view in the thickness direction T, the second opening peripheral edge 12 includes a portion 12c (third portion) disposed inside the terminal portion 31 and extending along the portion 11c and a portion 12d disposed outside the terminal portion 31 and extending along the portion 11d. The second opening peripheral edge 12 may also include the portion 12c (fourth portion) disposed outside the terminal portion 31 and extending along the portion 11c, and the portion 12d disposed outside the terminal portion 31 and extending along the portion 11d. These configurations are preferable from the viewpoint of both ensuring the support strength of the terminal portion 31 by the metal supporting substrate 10 and ensuring the opening space of the opening portion 10A.

In the modified example, a separation distance d5 (shown in FIG. 19) between the end edge of the terminal portion 31 and the portion 11c in the above-described projected view is preferably 5 μm or more, more preferably 10 μm or more. The separation distance d5 is preferably 400 μm or less, more preferably 300 μm or less. A separation distance d6 (shown in FIG. 19) between the end edge of the terminal portion 31 and the portion 11*d* in the above-described projected view is preferably 5 µm or more, more preferably 10 µm or more. The separation distance d6 is preferably 400 µm or less, more preferably 300 µm or less. The ratio of the length L3 shown in FIG. 19 of the first opening end 10*a* to the length L1 of the terminal portion 31 is preferably 0.31 or more and 0.99 or less. The ratio of the length L4 shown in FIG. 19 of the first opening end 10*a* to the length L2 of the terminal portion 31 is preferably 1.01 or more and 4 or less. The ratio of the length L5 shown in FIG. 19 of the second opening end 10*b* to the length L1 is preferably 0.31 or more and 0.99 or less. The ratio of the length L6 shown in FIG. 19 of the second opening end 10*b* to the length L2 is preferably 1.05 or more and 5 or less.

In the above-described wiring circuit board X1, a plurality of opening portions may be also provided for each terminal portion 31 instead of providing the one opening portion 10A for each terminal portion 31, where the plurality of opening portions face the terminal portion 31 through the insulating layer 20. Such a configuration may also adjust the characteristic impedance of the terminal portion 31.

Figure 22:
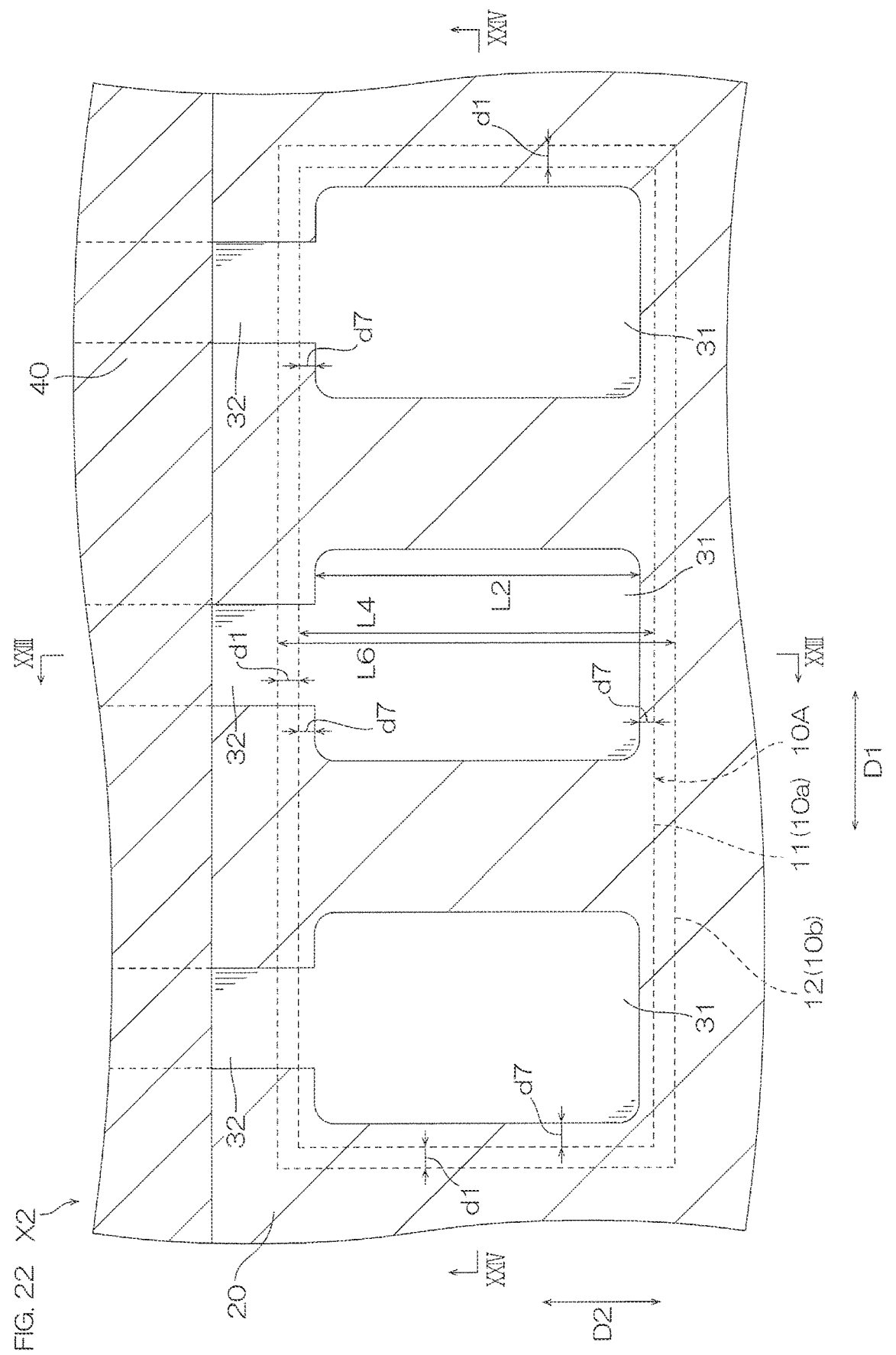
FIG. 22 shows a partially plan view of a second embodiment of a wiring circuit board of the present invention.
Figure 23:
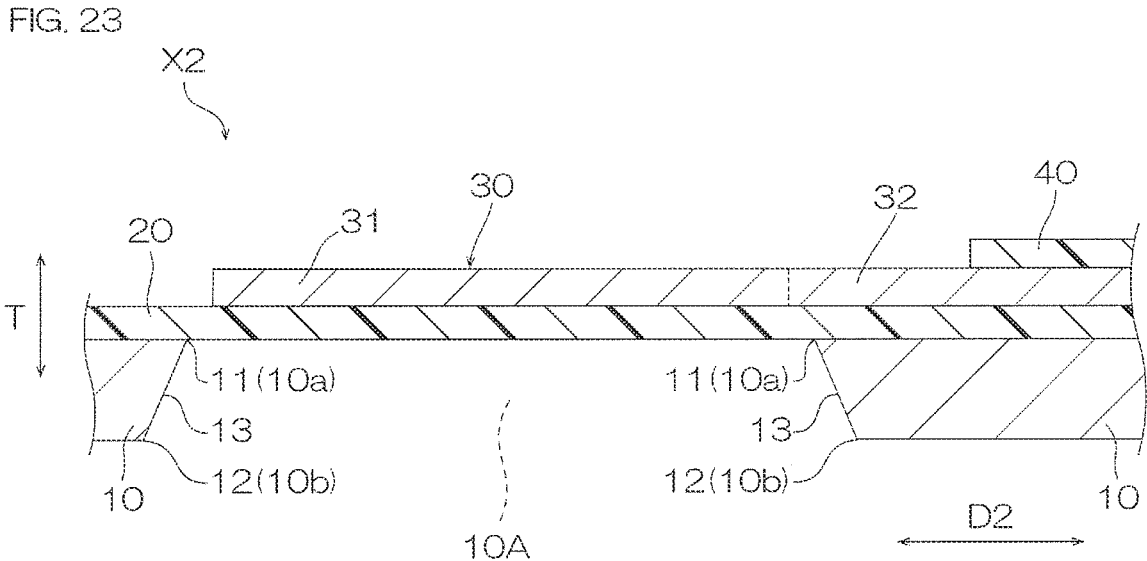
FIG. 23 shows a cross-sectional view along a XXIII-XXIII line of FIG. 22.
Figure 24:
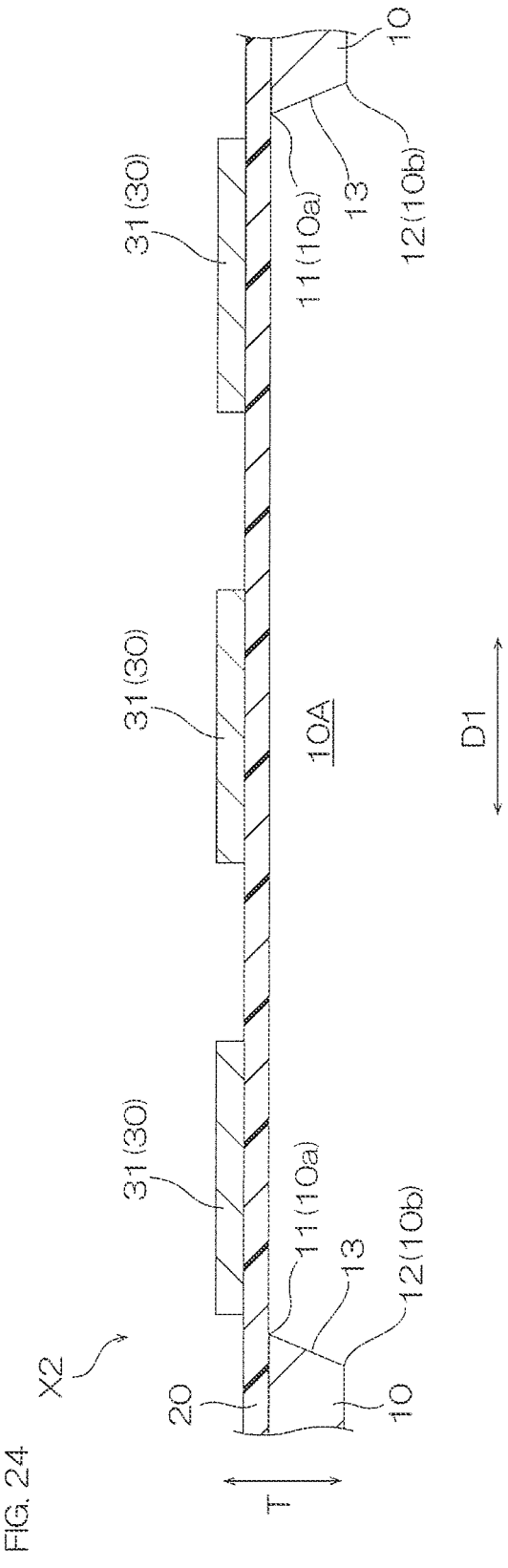
FIG. 24 shows a cross-sectional view along a XXIV-XXIV line of FIG. 22.

FIGS. 22 to 24 show a wiring circuit board X2 as a second embodiment of a wiring circuit board of the present invention. The wiring circuit board X2 includes the metal supporting substrate 10, the insulating layer 20 as a base insulating layer, the conductive layer 30, and the insulating layer 40 as a cover insulating layer in this order toward one side in the thickness direction T, in the same manner as the wiring circuit board X1. The wiring circuit board X2 is different from the wiring circuit board X1 in that the one opening portion 10A faces the plurality of terminal portions 31 through the insulating layer 20 (disposed in a row spaced apart in the first direction D1) instead of the opening portion 10A facing the one terminal portion 31 through the insulating layer 20. Other than this, the wiring circuit board X2 has the same configurations as the wiring circuit board X1.

As shown in FIG. 22, in the opening portion 10A in the wiring circuit board X2, in the projected view in the thickness direction T, the entire first opening peripheral edge 11 and the entire second opening peripheral edge 12 are disposed outside the terminal portion 31. Such a configuration is preferable from the viewpoint of ensuring the wide opening space of the opening portion 10A.

In the embodiment, a separation distance d7 between the end edge of the terminal portion 31 and the first opening peripheral edge 11 in the above-described projected view is preferably 5 µm or more, more preferably 10 µm or more. The separation distance d7 is preferably 400 µm or less, more preferably 300 µm or less. The ratio of the length L4 shown in FIG. 22 of the first opening end 10*a* to the length L2 of the terminal portion 31 is preferably 1.01 or more and 4 or less. The ratio of the length L6 shown in FIG. 22 of the second opening end 10*b* to the length L2 is preferably 1.01 or more and 5 or less.

Figure 25:
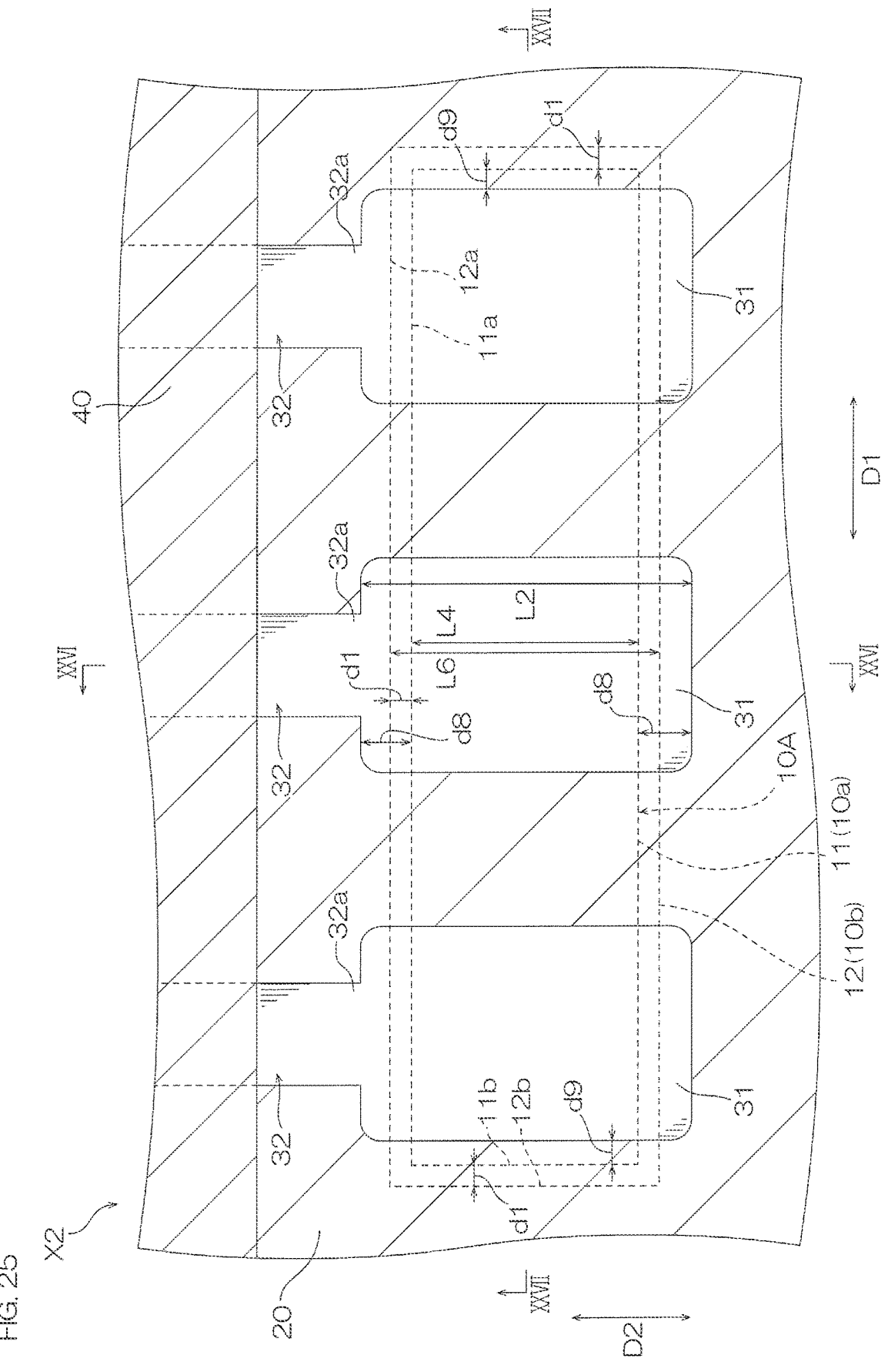
FIG. 25 shows a partially plan view of a modified example of the wiring circuit board shown in FIG. 22, and in the modified example, a first opening peripheral edge of an opening portion of a metal supporting substrate includes a first portion disposed inside a terminal portion and a second portion disposed outside the terminal portion in a projected view in a thickness direction.
Figure 26:
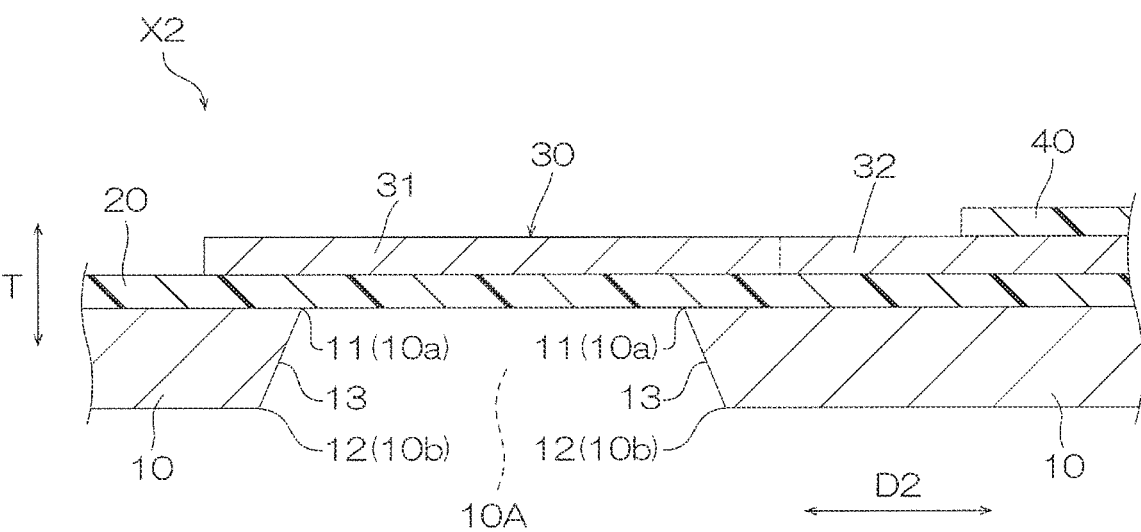
FIG. 26 shows a cross-sectional view along a XXVI-XXVI line of FIG. 25.
Figure 27:
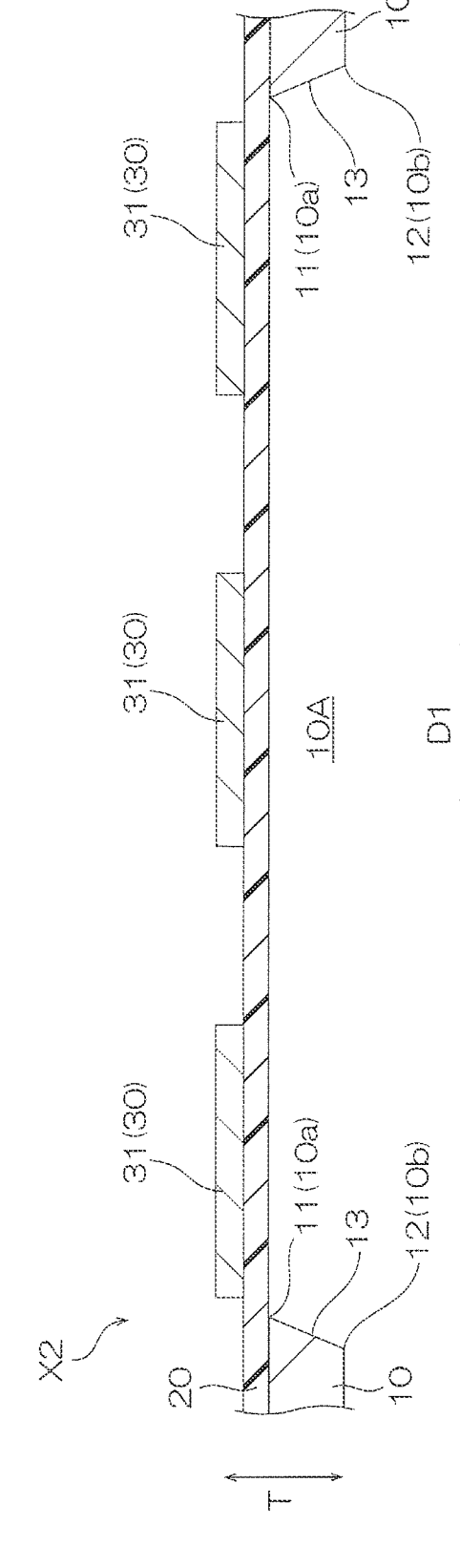
FIG. 27 shows a cross-sectional view along a XXVII-XXVII line of FIG. 25.

In the wiring circuit board X2, as shown in FIGS. 25 to 27, the first opening peripheral edge 11 of the opening portion 10A may also include the portion 11*a* (first portion) and the portion 11*b* (second portion). In the projected view in the thickness direction T, the portion 11*a* is disposed inside the terminal portion 31, and the portion 11*b* is disposed outside the terminal portion 31. The portion 11*a* extends in the first direction D1. The portion 11*b* includes a portion extending in the first direction D1 and a portion extending in the second direction D2. In the projected view in the thickness direction T, the second opening peripheral edge 12 includes the portion 12*a* (third portion) disposed inside the terminal portion 31 and extending along the portion 11*a*, and the portion 12*b* disposed outside the terminal portion 31 and extending along the portion 11*b*. The second opening peripheral edge 12 may also include the portion 12*a* (fourth portion) disposed outside the terminal portion 31 and extending along the portion 11*a*, and the portion 12*b* disposed outside the terminal portion 31 and extending along the portion 11*b*. These configurations are preferable from the viewpoint of both ensuring the support strength of the terminal portion 31 by the metal supporting substrate 10 and ensuring the opening space of the opening portion 10A.

In the modified example, a separation distance d8 (shown in FIG. 25) between the end edge of the terminal portion 31 and the portion 11*a* in the above-described projected view is preferably 5 µm or more, more preferably 10 µm or more. The separation distance d8 is preferably 400 µm or less, more preferably 300 µm or less. A separation distance d9 (shown in FIG. 25) between the end edge of the terminal portion 31 and the portion 11*b* in the above-described projected view is preferably 5 µm or more, more preferably 10 µm or more. The separation distance d9 is preferably 400 µm or less, more preferably 300 µm or less. The ratio of the length L4 shown in FIG. 25 of the first opening end 10*a* to the length L2 of the terminal portion 31 is preferably 0.31 or more and 0.99 or less. The ratio of the length L6 shown in FIG. 25 of the second opening end 10*b* to the length L2 is preferably 0.31 or more and 0.99 or less.

Figure 28:
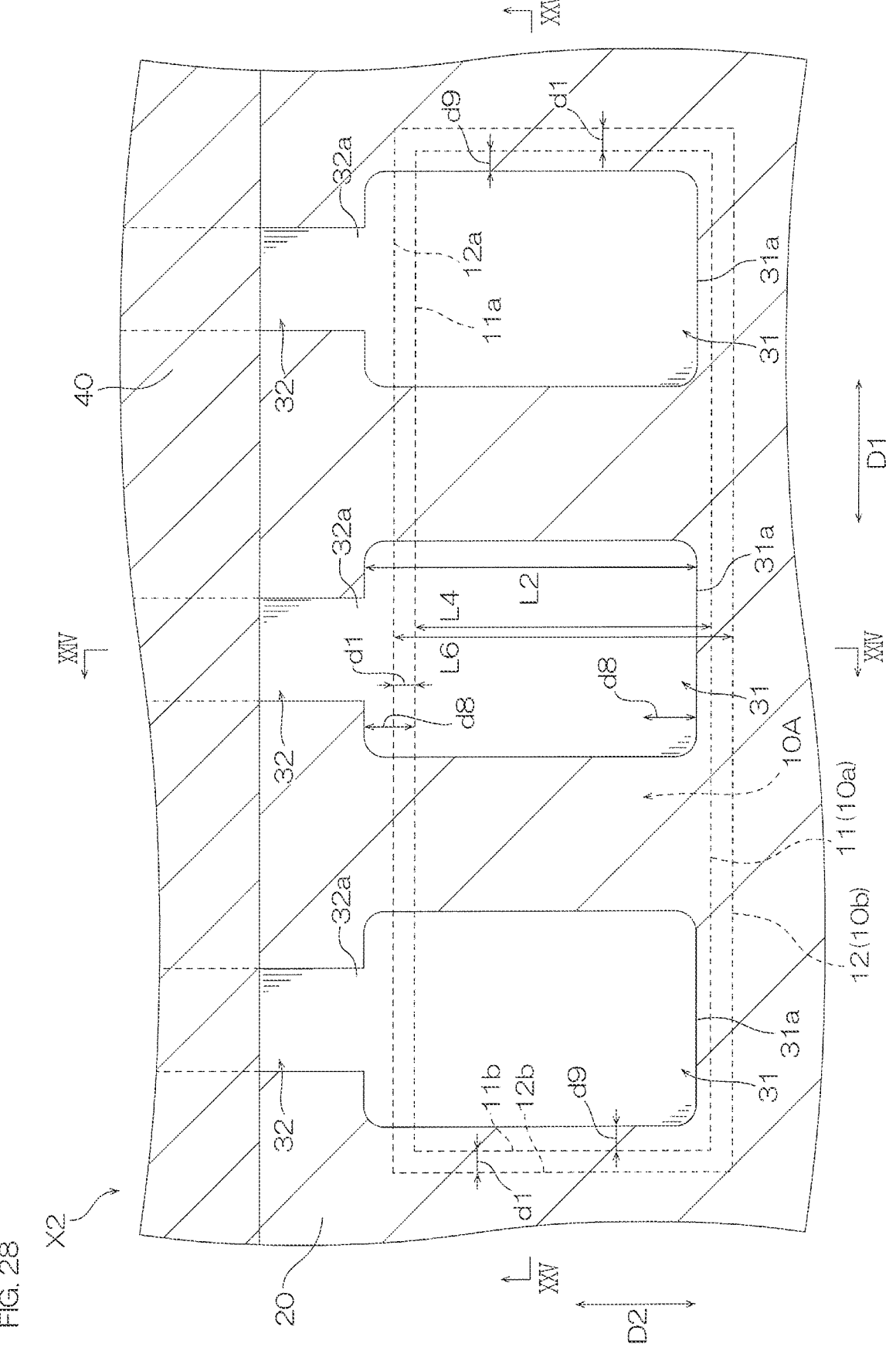
FIG. 28 shows a partially plan view of a modified example of the wiring circuit board shown in FIGS. 25 to 27, and in the modified example, in comparison with the modified example shown in FIG. 25, an end portion on the opposite side to the wiring portion connection-side in each terminal portion is located above the opening portion in the projected view in the thickness direction.

In the above-described modified examples shown in FIGS. 25 to 27, as shown in FIG. 28, the end portion 31*a* on the opposite side to the wiring portion 32 connection-side in each terminal portion 31 may be also located above the first opening end 10*a* of the opening portion 10A in the projected view in the thickness direction T.

Figure 29:
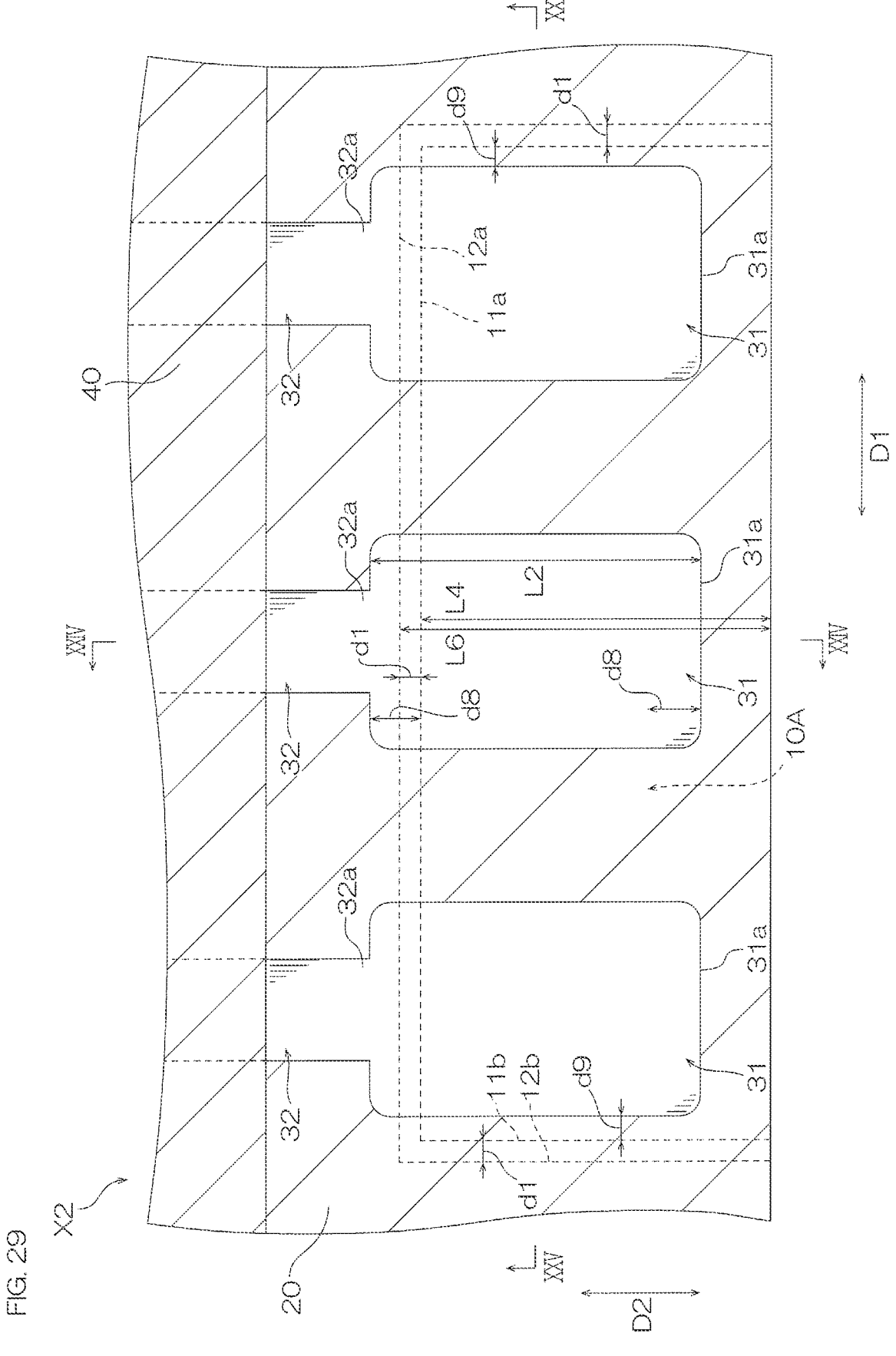
FIG. 29 shows a partially plan view of a modified example of the wiring circuit board shown in FIGS. 25 to 27; in the modified example, in comparison with the modified example shown in FIG. 25, an end portion on the opposite side to the wiring portion connection-side in each terminal portion is located above the opening portion in the projected view in the thickness direction; and the opening portion has an opening in a plane direction.

In the modified example shown in FIG. 28, when the terminal portion 31 is formed near the end edge of the metal supporting substrate 10, as shown in FIG. 29, the opening portion 10A may open in the plane direction.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention may be, for example, used for a wiring circuit board including a metal supporting substrate as a supporting substrate.

DESCRIPTION OF REFERENCE NUMERALS

X1, X2 Wiring circuit board
T Thickness direction
10 Metal supporting substrate
10A Opening portion
10*a* First opening end
10*b* Second opening end
11 First opening peripheral edge
12 Second opening peripheral edge
13 Inner wall surface
20, 40 Insulating layer
30 Conductive layer
31 Terminal portion
32 Wiring portion

The invention claimed is:

1. A wiring circuit board comprising:

a metal supporting substrate, an insulating layer, and a conductive layer in this order toward one side in a thickness direction, wherein the conductive layer includes at least one terminal portion and a wiring portion extending from the terminal portion;

the metal supporting substrate has an opening portion that penetrates the metal supporting substrate in the thickness direction and faces the terminal portion through the insulating layer; and the opening portion has a first opening peripheral edge on one side in the thickness direction and a second opening peripheral edge on the other side in the thickness direction;

wherein in a projected view in the thickness direction, the second opening peripheral edge is disposed outside the first opening peripheral edge and extends along the first opening peripheral edge, and wherein, in the projected view, the entire first opening peripheral edge is disposed outside the terminal portion.

2. The wiring circuit board according to claim 1, wherein the first opening peripheral edge includes a first portion disposed inside the terminal portion in the projected view, and a second portion disposed outside the terminal portion in the projected view.

3. The wiring circuit board according to claim 2, wherein the second opening peripheral edge includes a third portion disposed inside the terminal portion and extends along the first portion in the projected view.

4. The wiring circuit board according to claim 2, wherein the second opening peripheral edge includes a fourth portion disposed outside the terminal portion and extends along the first portion in the projected view.

5. The wiring circuit board according to claim 1, wherein the conductive layer includes a plurality of terminal portions, and the opening portion faces the plurality of terminal portions through the insulating layer.

6. The wiring circuit board according to claim 1, wherein the opening portion has a curved wall surface disposed between the first opening peripheral edge and the second opening peripheral edge and curving so as to bulge outwardly.

7. The wiring circuit board according to claim 1, wherein a separation distance between the first opening peripheral edge and the second opening peripheral edge in the projected view is 20 μm or more and 120 μm or less.

8. The wiring circuit board according to claim 1, wherein the metal supporting substrate has a thickness of 20 μm or more and 250 μm or less.

9. A wiring circuit board comprising:

a metal supporting substrate, an insulating layer, and a conductive layer in this order toward one side in a thickness direction, wherein the conductive layer includes at least one terminal portion and a wiring portion extending from the terminal portion;

the metal supporting substrate has an opening portion that penetrates the metal supporting substrate in the thickness direction and faces the terminal portion through the insulating layer; and the opening portion has a first opening peripheral edge on one side in the thickness direction and a second opening peripheral edge on the other side in the thickness direction;

wherein in a projected view in the thickness direction, the second opening peripheral edge is disposed outside the first opening peripheral edge and extends along the first opening peripheral edge, wherein, in the projected view, the entire first opening peripheral edge is disposed inside the terminal portion, and wherein, in the projected view, the entire second opening peripheral edge is disposed outside the terminal portion.

10. A wiring circuit board comprising:

a metal supporting substrate, an insulating layer, and a conductive layer in this order toward one side in a thickness direction, wherein the conductive layer includes at least one terminal portion and a wiring portion extending from the terminal portion;

the metal supporting substrate has an opening portion that penetrates the metal supporting substrate in the thickness direction and faces the terminal portion through the insulating layer; and the opening portion has a first opening peripheral edge on one side in the thickness direction and a second opening peripheral edge on the other side in the thickness direction;

wherein in a projected view in the thickness direction, the second opening peripheral edge is disposed outside the first opening peripheral edge and extends along the first opening peripheral edge, and wherein the first opening peripheral edge includes a first portion disposed inside the terminal portion in the projected view, and a second portion disposed outside the terminal portion in the projected view.

11. A wiring circuit board comprising:

a metal supporting substrate, an insulating layer, and a conductive layer in this order toward one side in a thickness direction, wherein the conductive layer includes at least one terminal portion and a wiring portion extending from the terminal portion;

the metal supporting substrate has an opening portion that penetrates the metal supporting substrate in the thickness direction and faces the terminal portion through the insulating layer; and the opening portion has a first opening peripheral edge on one side in the thickness direction and a second opening peripheral edge on the other side in the thickness direction;

wherein in a projected view in the thickness direction, the second opening peripheral edge is disposed outside the first opening peripheral edge and extends along the first opening peripheral edge; and wherein the opening portion has a curved wall surface disposed between the first opening peripheral edge and the second opening peripheral edge and curving so as to bulge outwardly.

12. A wiring circuit board comprising:

a metal supporting substrate, an insulating layer, and a conductive layer in this order toward one side in a thickness direction, wherein the conductive layer includes at least one terminal portion and a wiring portion extending from the terminal portion;

the metal supporting substrate has an opening portion that penetrates the metal supporting substrate in the thickness direction and faces the terminal portion through the insulating layer; and the opening portion has a first opening peripheral edge on one side in the thickness direction and a second opening peripheral edge on the other side in the thickness direction;

wherein in a projected view in the thickness direction, the second opening peripheral edge is disposed outside the first opening peripheral edge and extends along the first opening peripheral edge;

wherein in the projected view, at least a part of the first opening peripheral edge is disposed inside the terminal portion, and at least a part of the second opening peripheral edge is disposed outside the terminal portion; and wherein the terminal portion includes a first conductive layer on the insulating layer side, and a second conductive layer on the first conductive layer.

13. A wiring circuit board comprising:

a metal supporting substrate, an insulating layer, and a conductive layer in this order toward one side in a thickness direction, wherein the conductive layer includes at least one terminal portion and a wiring portion extending from the terminal portion;

the metal supporting substrate has an opening portion that penetrates the metal supporting substrate in the thickness direction and faces the terminal portion through the insulating layer;

the insulating layer is disposed between the opening portion and the terminal portion, and covers the entire opening portion; and the opening portion has a first opening peripheral edge on one side in the thickness direction and a second opening peripheral edge on the other side in the thickness direction; and wherein in a projected view in the thickness direction, the second opening peripheral edge is disposed outside the first opening peripheral edge and extends along the first opening peripheral edge.

* * * * *